US009589726B2

(12) United States Patent
Gabig et al.

(10) Patent No.: US 9,589,726 B2
(45) Date of Patent: Mar. 7, 2017

(54) MAGNETICALLY ENHANCED ENERGY STORAGE SYSTEMS AND METHODS

(71) Applicant: E1023 Corporation, Ronan, MT (US)

(72) Inventors: Daniel Albert Gabig, Polson, MT (US); Matthew B. Jore, Ronan, MT (US)

(73) Assignee: E1023 CORPORATION, Ronan, MT (US)

( * ) Notice: Subject to any disclaimer, the term of this patent is extended or adjusted under 35 U.S.C. 154(b) by 52 days.

(21) Appl. No.: 14/503,788

(22) Filed: Oct. 1, 2014

(65) Prior Publication Data

US 2015/0092317 A1    Apr. 2, 2015

Related U.S. Application Data

(60) Provisional application No. 61/885,242, filed on Oct. 1, 2013.

(51) Int. Cl.
| | | |
|---|---|---|
| *G11C 11/00* | (2006.01) |
| *H01G 4/12* | (2006.01) |
| *H01G 4/008* | (2006.01) |
| *H01L 49/02* | (2006.01) |

(52) U.S. Cl.
CPC ........... *H01G 4/1272* (2013.01); *H01G 4/008* (2013.01); *H01L 28/60* (2013.01); *Y10T 29/435* (2015.01)

(58) Field of Classification Search
CPC .................................................... H01L 27/222
USPC ......................................................... 361/305
See application file for complete search history.

(56) References Cited

U.S. PATENT DOCUMENTS

| | | |
|---|---|---|
| 5,297,077 A | 3/1994 | Imai et al. |
| 5,335,138 A | 8/1994 | Sandhu et al. |
| 6,214,687 B1 | 4/2001 | Sandhu et al. |
| 6,219,275 B1 | 4/2001 | Nishimura |
| 6,395,602 B2 | 5/2002 | Sandhu et al. |
| 6,404,672 B2 | 6/2002 | Sato et al. |
| 6,492,241 B1 | 12/2002 | Rhodes et al. |

(Continued)

FOREIGN PATENT DOCUMENTS

| | | |
|---|---|---|
| DE | 102007033253 A1 | 7/2008 |
| DE | 202009014941 U1 | 11/2010 |

(Continued)

OTHER PUBLICATIONS

International Search Report and Written Opinion for International Application No. PCT/US2014/058612 mailed Dec. 30, 2014.

(Continued)

*Primary Examiner* — Alexander Talpalatski
(74) *Attorney, Agent, or Firm* — McClure, Qualey & Rodack, LLP

(57) ABSTRACT

In one embodiment, a system, comprising: a first non-magnetic conductive electrode; a second non-magnetic conductive electrode; a dielectric layer disposed between the first and second electrodes, the dielectric layer extending between the first and second electrodes; and first and second layers comprising plural pairs of magnetically coupled pairings of discrete magnets, the first and second layers separated by a non-magnetic material, wherein the magnets of at least the first layer are conductively connected to the first non-magnetic conductive electrode.

8 Claims, 17 Drawing Sheets

(56) References Cited

U.S. PATENT DOCUMENTS

| | | |
|---|---|---|
| 6,518,734 B1 | 2/2003 | Nourai et al. |
| 6,570,753 B2 | 5/2003 | Bensaoula et al. |
| 6,653,154 B2 | 11/2003 | Doan et al. |
| 6,657,270 B2 | 12/2003 | Kim et al. |
| 6,661,088 B1 | 12/2003 | Yoda et al. |
| 6,667,502 B1 | 12/2003 | Agarwal et al. |
| 6,700,145 B1 | 3/2004 | Black et al. |
| 6,746,912 B2 | 6/2004 | Nakata |
| 6,762,450 B2 | 7/2004 | Sandhu et al. |
| 6,869,877 B2 | 3/2005 | Rhodes et al. |
| 6,900,496 B1 | 5/2005 | Sandhu et al. |
| 6,940,112 B2 | 9/2005 | Rhodes et al. |
| 6,969,775 B2 | 11/2005 | Bhattacharya et al. |
| 7,005,697 B2 | 2/2006 | Batra et al. |
| 7,206,221 B2 | 4/2007 | Agan et al. |
| 7,256,616 B1 | 8/2007 | Agan et al. |
| 7,269,061 B2 | 9/2007 | Agan et al. |
| 7,282,756 B2 | 10/2007 | Agarwal et al. |
| 7,304,830 B2 | 12/2007 | Iwanaga |
| 7,379,321 B2 | 5/2008 | Ravelosona et al. |
| 7,396,750 B2 | 7/2008 | Wilson et al. |
| 7,397,277 B2 | 7/2008 | Agan et al. |
| 7,397,285 B2 | 7/2008 | Agan et al. |
| 7,400,176 B2 | 7/2008 | Agan et al. |
| 7,403,043 B2 | 7/2008 | Agan et al. |
| 7,405,599 B2 | 7/2008 | Agan et al. |
| 7,423,328 B2 | 9/2008 | Lai et al. |
| 7,436,218 B2 | 10/2008 | Agan et al. |
| 7,452,759 B2 | 11/2008 | Sandhu |
| 7,457,184 B2 | 11/2008 | Basceri et al. |
| 7,468,906 B2 | 12/2008 | Kuo et al. |
| 7,488,665 B2 | 2/2009 | Agarwal et al. |
| 7,489,589 B2 | 2/2009 | Chen et al. |
| 7,492,021 B2 | 2/2009 | Lai et al. |
| 7,529,078 B2 | 5/2009 | Wang et al. |
| 7,539,046 B2 | 5/2009 | Lai et al. |
| 7,579,196 B2 | 8/2009 | Wilson et al. |
| 7,592,659 B2 | 9/2009 | Isogai |
| 7,684,147 B2 | 3/2010 | Ahn et al. |
| 7,702,942 B2 | 4/2010 | Chen et al. |
| 7,745,893 B2 | 6/2010 | Lai et al. |
| 7,791,216 B2 | 9/2010 | Xu et al. |
| 7,807,492 B2 | 10/2010 | Wilson et al. |
| 7,816,718 B2 | 10/2010 | Wilson et al. |
| 7,821,771 B2 | 10/2010 | Lai |
| 7,847,586 B2 | 12/2010 | Agan et al. |
| 7,903,387 B2 * | 3/2011 | Masuda ............... H01G 4/005 361/303 |
| 7,910,969 B2 | 3/2011 | Wilson et al. |
| 7,911,187 B2 | 3/2011 | Lai et al. |
| 8,149,568 B2 | 4/2012 | Lai et al. |
| 8,269,453 B2 | 9/2012 | Ludtke |
| 8,564,039 B2 | 10/2013 | Sandhu |
| 9,142,354 B2 * | 9/2015 | Chang ............... H01G 4/002 |
| 2006/0039190 A1 * | 2/2006 | Kim ............... G11C 11/16 365/158 |
| 2006/0081911 A1 | 4/2006 | Batra et al. |
| 2007/0247784 A1 * | 10/2007 | Wang ............... H01G 4/005 361/311 |
| 2008/0062614 A1 * | 3/2008 | Goia ............... H01C 7/18 361/311 |
| 2008/0174933 A1 | 7/2008 | Lai et al. |
| 2008/0174936 A1 | 7/2008 | Lai et al. |
| 2009/0015983 A1 | 1/2009 | Agan et al. |
| 2009/0050999 A1 | 2/2009 | Lai et al. |
| 2009/0053512 A1 | 2/2009 | Pyun et al. |
| 2009/0085085 A1 | 4/2009 | Lai et al. |
| 2009/0090946 A1 * | 4/2009 | Lai ............... G11C 11/14 257/296 |
| 2009/0095338 A1 | 4/2009 | Lai et al. |
| 2009/0141423 A1 * | 6/2009 | Lai ............... H01G 4/005 361/303 |
| 2009/0233381 A1 * | 9/2009 | Wilson ............... H01L 43/12 438/3 |
| 2009/0289289 A1 | 11/2009 | Lai |
| 2009/0295517 A1 | 12/2009 | Lai et al. |
| 2010/0015518 A1 | 1/2010 | Chan |
| 2010/0109609 A1 | 5/2010 | Chan |
| 2010/0112438 A1 | 5/2010 | Chan |
| 2010/0142116 A1 | 6/2010 | Kim et al. |
| 2010/0194331 A1 | 8/2010 | Lai et al. |
| 2010/0202099 A1 | 8/2010 | Yeh |
| 2010/0214718 A1 * | 8/2010 | Yeh ............... H01L 28/60 361/305 |
| 2010/0302703 A1 | 12/2010 | Hwang |
| 2011/0013339 A1 * | 1/2011 | Lai ............... H01G 4/008 361/305 |
| 2011/0051313 A1 | 3/2011 | Hwang |
| 2011/0084349 A1 | 4/2011 | Uchida et al. |
| 2011/0242726 A1 * | 10/2011 | Chan ............... H01G 4/06 361/311 |
| 2011/0248778 A1 | 10/2011 | Sandhu |
| 2012/0099240 A1 | 4/2012 | Chang |
| 2013/0148262 A1 | 6/2013 | Shimizu |
| 2014/0042270 A1 | 2/2014 | Lai |
| 2014/0042987 A1 | 2/2014 | Lai |

FOREIGN PATENT DOCUMENTS

| | | |
|---|---|---|
| EP | 1658872 B1 | 3/2011 |
| GB | 2445811 A | 7/2008 |
| GB | 2452093 A | 2/2009 |

OTHER PUBLICATIONS

Sebastian Anthony: "New lithium-ion battery design that's 2,000 times more powerful, recharges 1,000 times faster"; Copyright 1996-2015 Ziff Davis, LLC; http://www.extremetech.com/computing/153614-new-lithium-ion-battery-design-thats-2000-times-more-powerful-recharges-1000-times-faster.

* cited by examiner

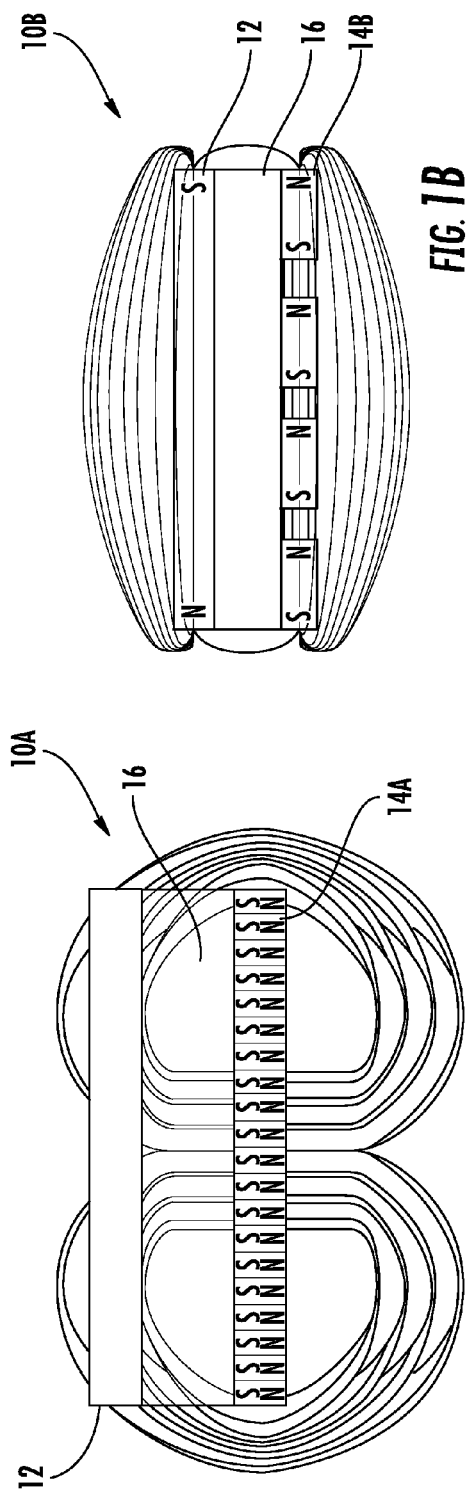
FIG. 1A
(PRIOR ART)
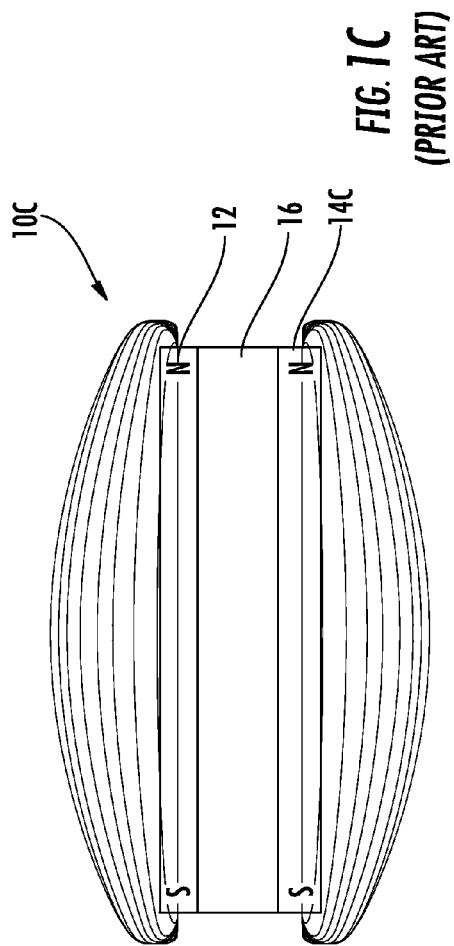
FIG. 1B
(PRIOR ART)
FIG. 1C
(PRIOR ART)

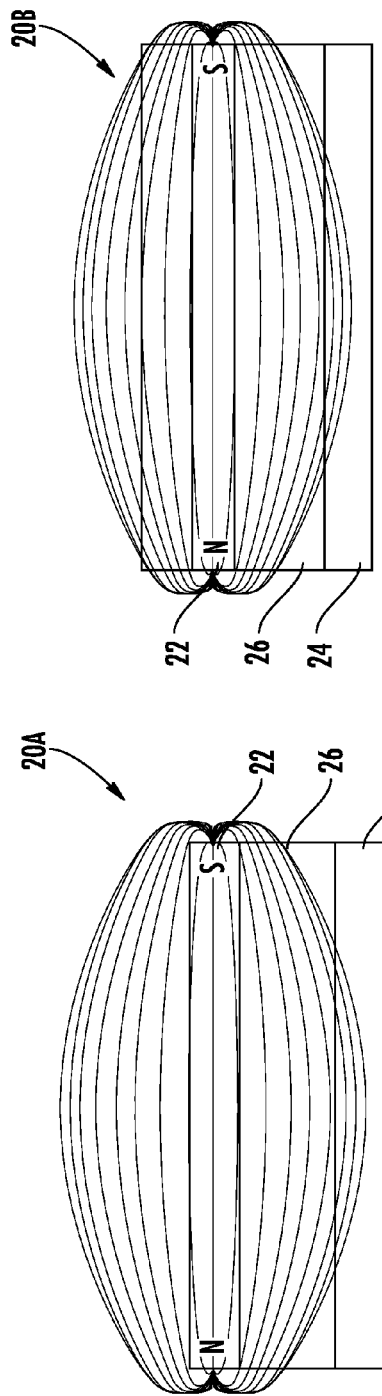
FIG. 2A
(PRIOR ART)
FIG. 2B
(PRIOR ART)
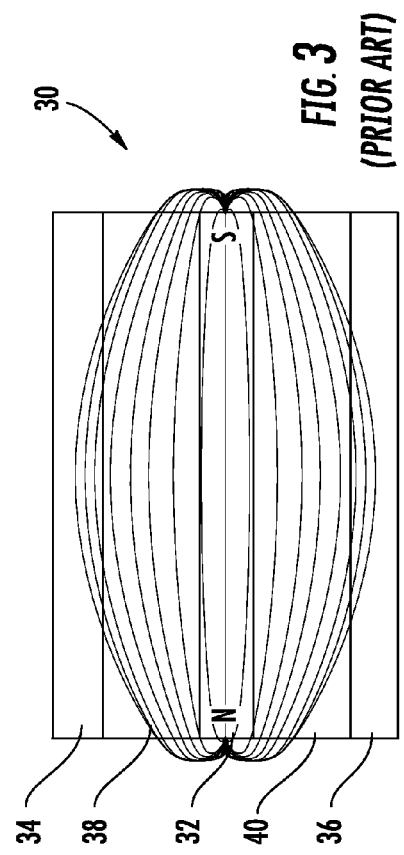
FIG. 3
(PRIOR ART)

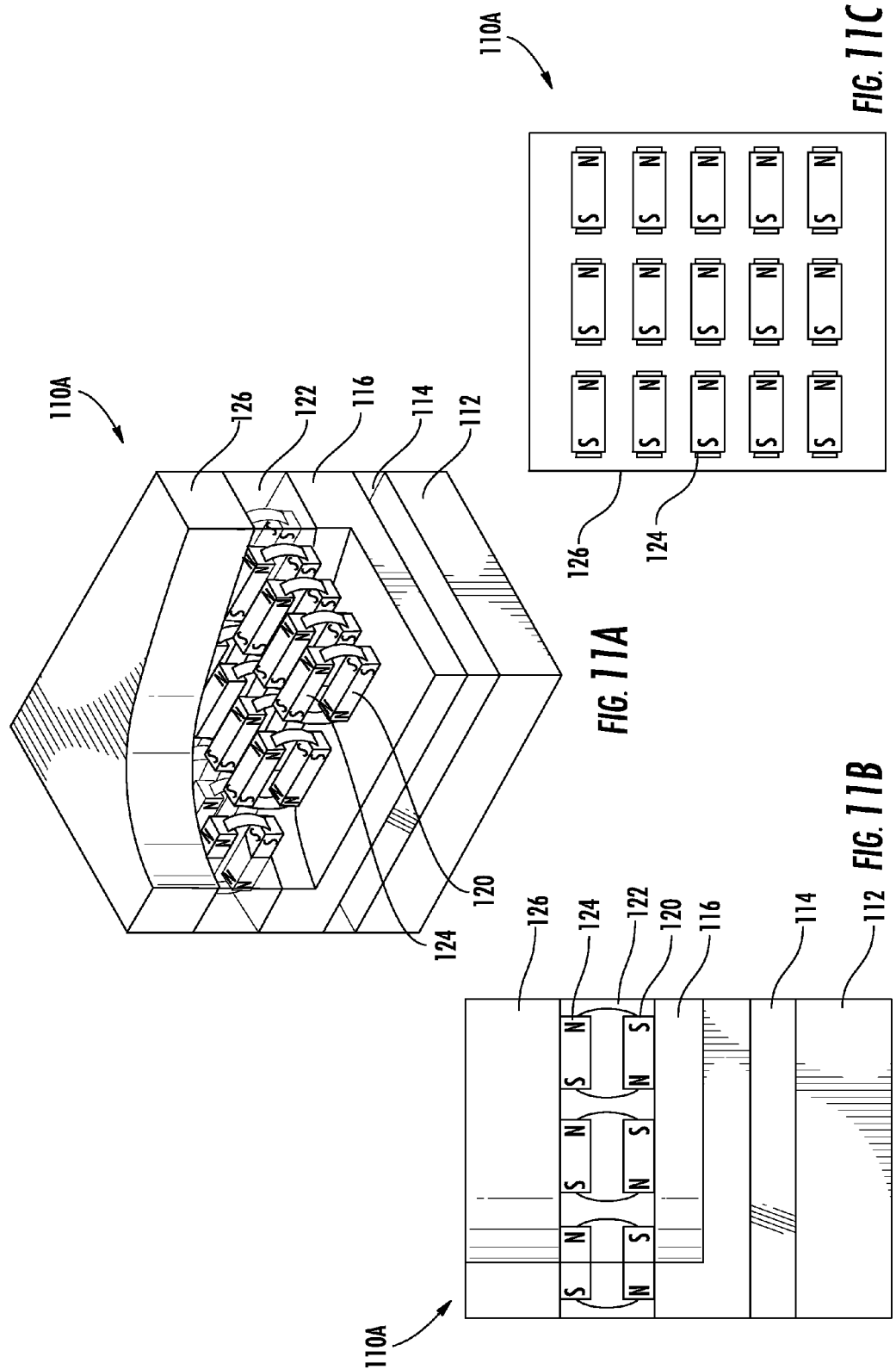

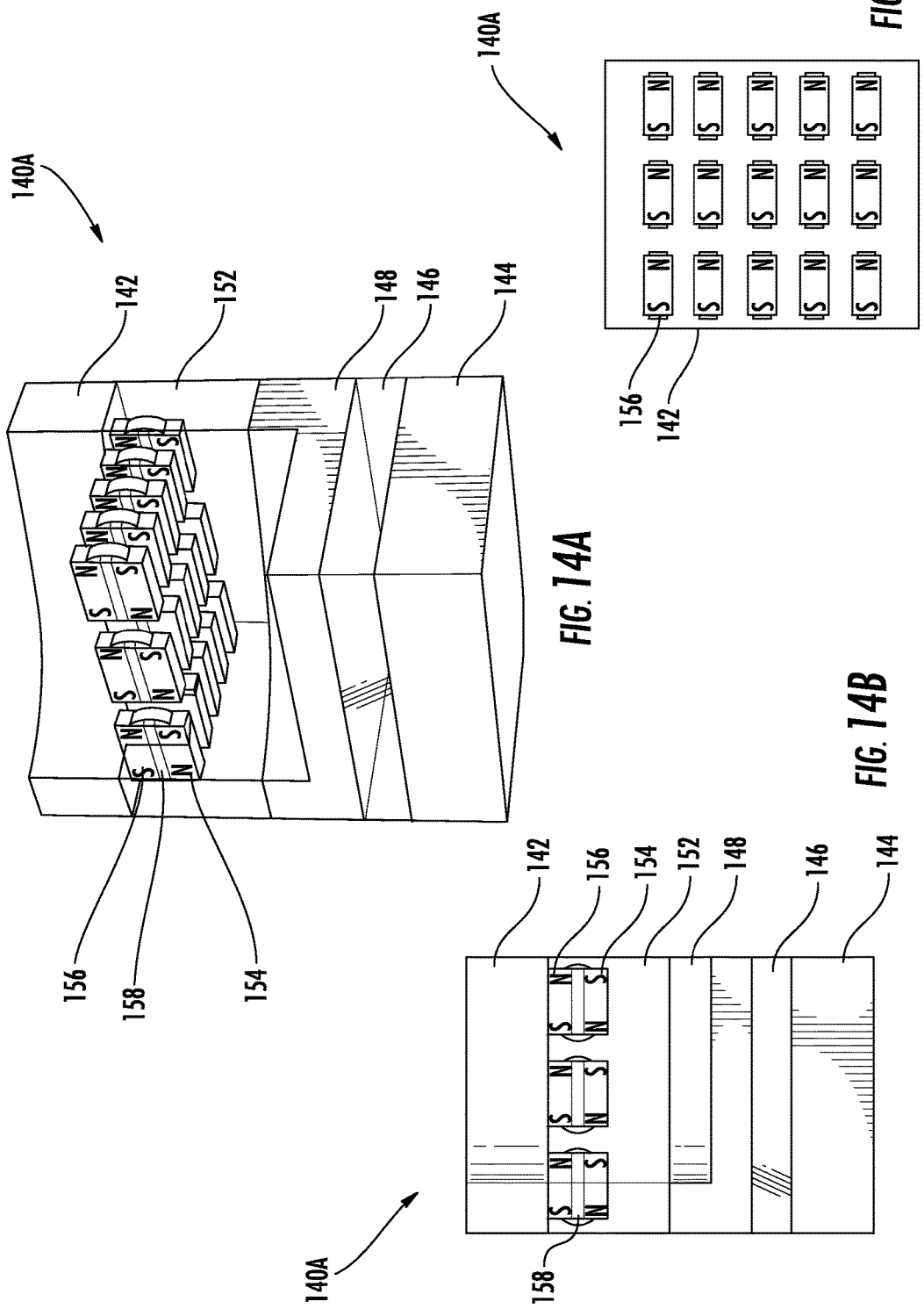

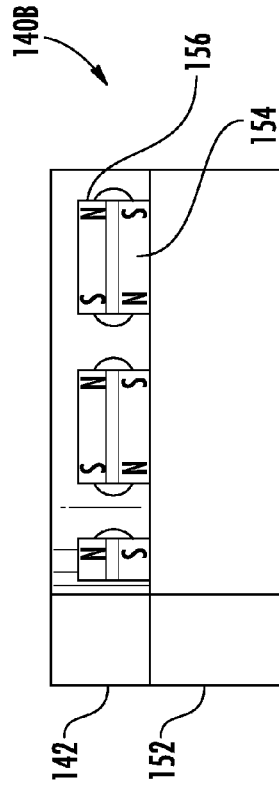
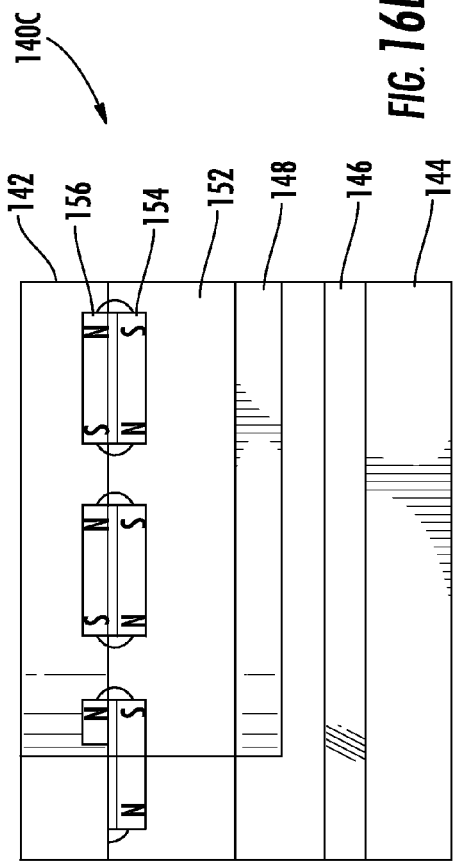
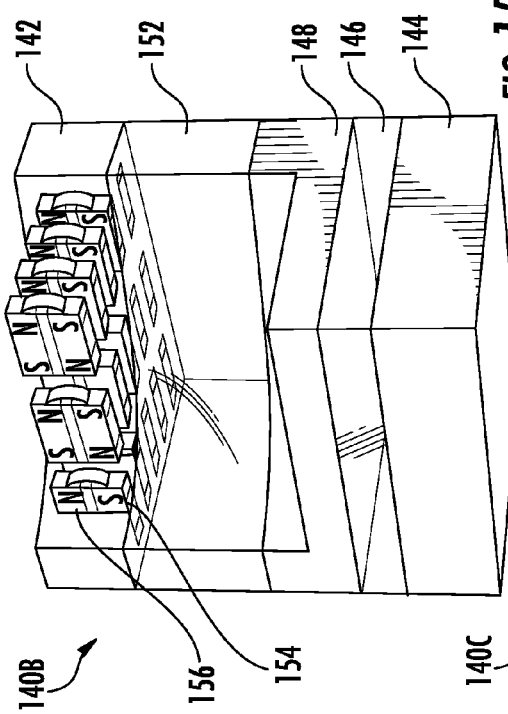
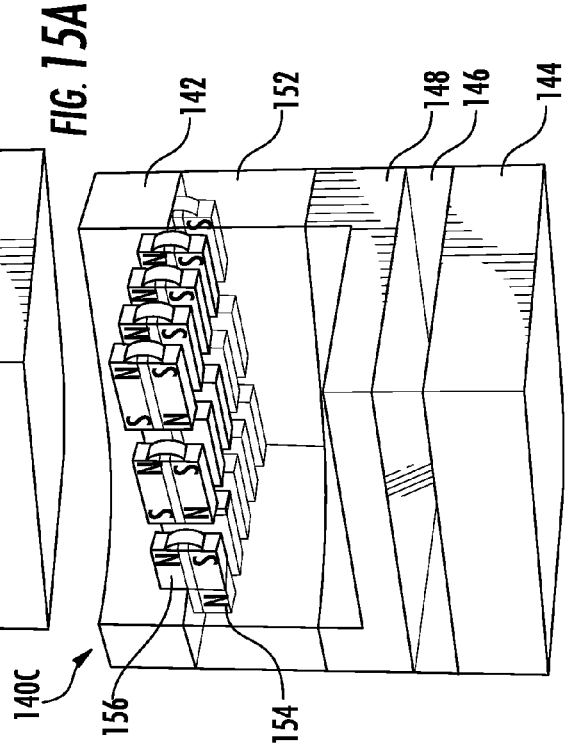
FIG. 15A  FIG. 15B
FIG. 16A  FIG. 16B

| STRUCTURE | MATERIAL | THICK (ANG) |
|---|---|---|
| "METAL TOP" | ALUM/TiW/CrSi | 3000/500/200 |
| MAG2 DISCRETE SHAPES | CoFe/NiFe/CoFe/Ta(Neg Mag FIELD) | 40/60/40/15 |
| TEOS | SiN OR SiO2 (OR HIGH K MATERIAL) | 10-100 |
| MAG1 DISCRETE SHAPES | CoFe/NiFe/CoFe (Pos MAG FIELD) | 50/100/50 |
| TEOS | SiO2 | 300-500 |
| "METAL BOTTOM" | ALUM/TiW/CrSi/Ta | 3000/500/400/15 |
| SUBSTRATE | GLASS | |

FIG. 17

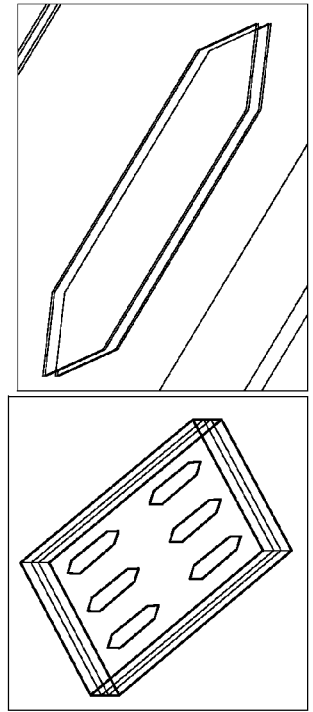

2X3 MAGNET ARRAY ANALYSIS

GEOMETRY VALUES
MAGNET LENGTH: 2750 nm
MAGNET WIDTH: 500 nm
MAGNET ANGLE: 30°
MAGNET THICKNESS: 140A

MAGNET SPACINGS
X-AXIS: 1600 nm
Y-AXIS: 1550 nm
Z-AXIS: 450 nm (BETWEEN MAGNETS)

FIG. 18

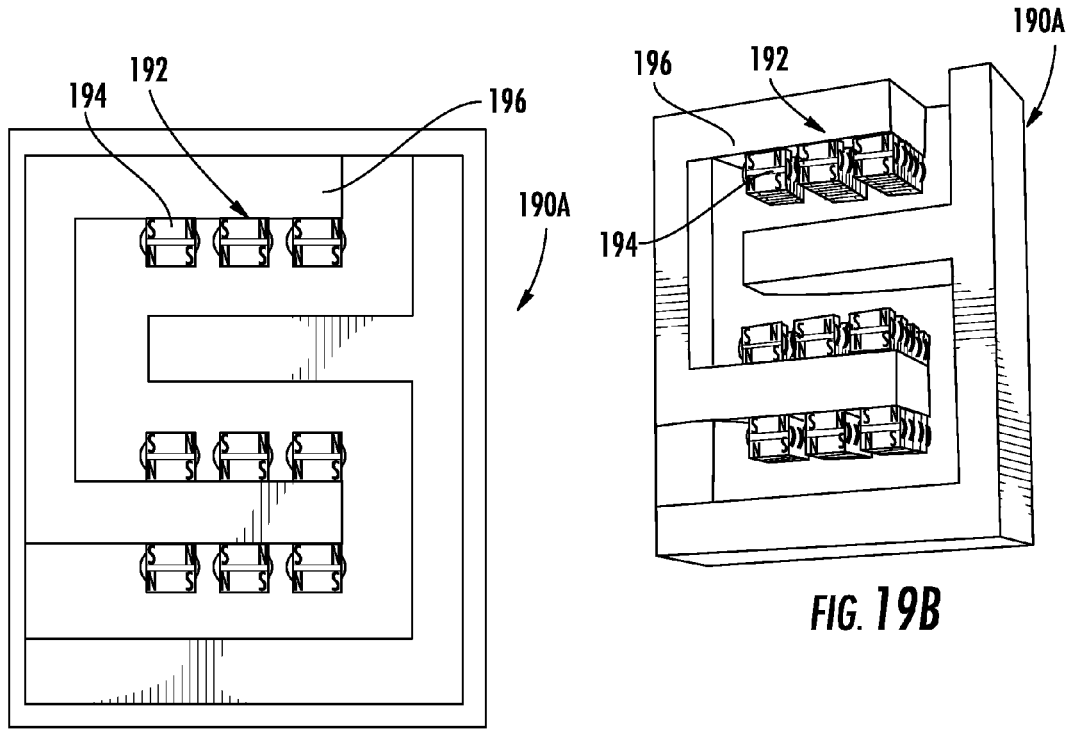
FIG. 19A
FIG. 19B
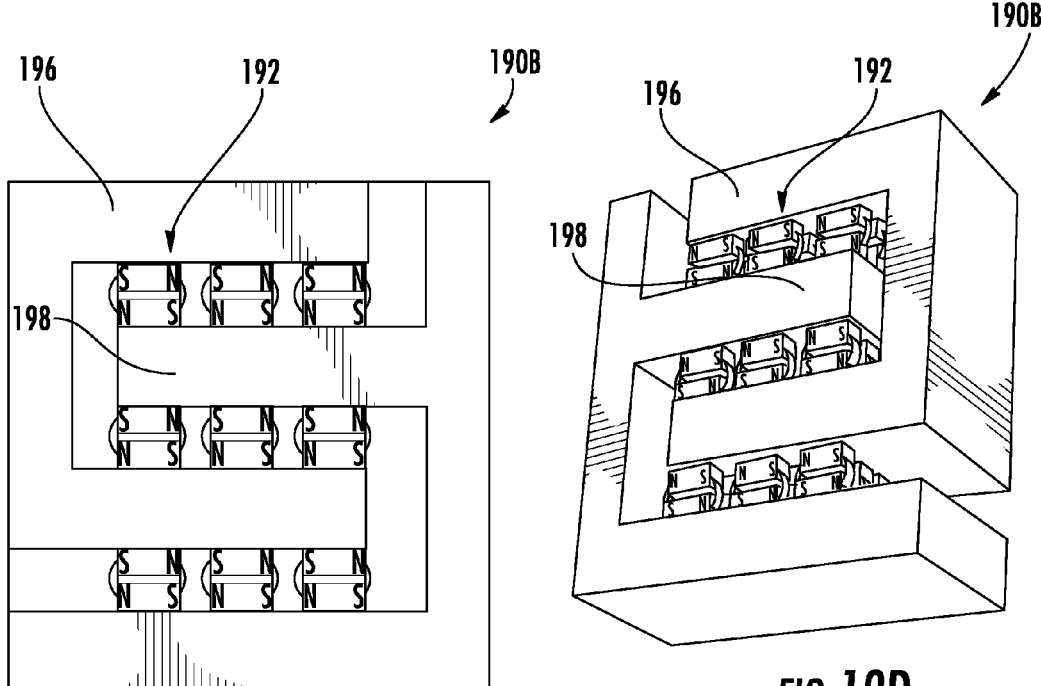
FIG. 19C
FIG. 19D

MAGNETICALLY ENHANCED ENERGY STORAGE SYSTEMS AND METHODS

CROSS REFERENCE TO RELATED APPLICATION

This application claims the benefit of U.S. Provisional Application No. 61/885,242 filed Oct. 1, 2013, which is hereby incorporated by reference in its entirety.

TECHNICAL FIELD

The present disclosure is generally related to storage devices, and, more particularly, to magnetically enhanced storage devices.

BACKGROUND

A review of prior art capacitor devices that utilize magnetic materials as part of their construction reveals that they can generally be grouped as to structure and function into three constructs. The three constructs all commonly claim and define at least one magnetic structure that contiguously spans the entire device, inherently resulting in magnetic flux circuitry to reside outside of, and thus stray to, the capacitive portion of each and every prior art device. Such stray magnetic flux is not beneficially influential to energy density inside the device, and the contiguous span of the magnetic structure limits the magnetic field intensity and/or the prior art's magnetic circuitry is caused to pass through comparatively long paths through high reluctance materials, which causes substantial field-weakening of the magnetic flux residing within the capacitive portion of the device. This limited field intensity and field-weakening increases exponentially with increasing dimensional scale as opposing pole coupling distance increases. The three general constructs of the prior art are described and illustrated as follows. Referring to FIGS. 1A-1C, shown is a magnetic capacitor structure 10 (e.g., 10A, 10B, and 10C, respectively) comprising electrodes 12 and 14 (e.g., 14A-14C), with a dielectric 16 disposed between the electrodes 12 and 14. The magnets are the positive and negative electrode plates 12 and 14, which at least one of the magnetic electrodes 12 bridge the full expanse of the capacitor structure 10 and sandwich the dielectric layer 16 between the magnetic electrodes 12 and 14, and the other magnetic electrode 14 can either also span the full expanse of the capacitor structure 10 (e.g., electrode 14C in structure 10C in FIG. 1C) or alternatively can be broken up into sections of connected magnets or discrete magnetic components, as shown in FIGS. 1A-1B.

Referring to FIGS. 2A-2B, shown are magnetic capacitor structure 20 (e.g., 20A and 20B), including a magnetic electrode 22 and a non-magnetic electrode 24. In this example structure 20, only one of the electrode plates 22 are magnetic and the magnetic electrode again bridges the full expanse of a surface of the capacitor structure 20, and a dielectric layer 26 is sandwiched between the magnetic electrode 22 and the non-magnetic electrode 24.

FIG. 3 shows another example magnetic capacitor structure 30 comprising a magnetic layer 32, non-magnetic electrodes 34 and 36, and dielectrics 38 (sandwiched between the magnetic layer 32 and electrode 34) and 40 (sandwiched between magnetic layer 32 and electrode 36). In other words, a (non-electrode) magnet 32 that bridges the full expanse of the capacitor structure 30 is not a positive or negative electrode, and is sandwiched between dielectric layers 38 and 40, which dielectric layers 38 and 40 are in turn sandwiched between non-magnetic electrode plates 34 and 36.

Evident from analysis of all of these types of structures is that there is a commonly shared, and inherently limiting, attribute of all such prior art (particularly as to full expanse magnetic constructions), which is that their magnetic circuit (path) involves flux that passes outside and astray of the capacitor structure, and thus their stray flux is non-influential towards enhancing the potential capacitance of the dielectric or internal structure. Additionally, if the magnetic electrodes are in parallel as to magnetic polarity, or have perpendicular to plane orientation magnetic polarity, such prior art structures inherently do not scale beneficially because as the size of their plate dimensions increase so too does the magnetic flux return path distance of travel through high reluctance material. A lengthy high reluctance distance of travel for the magnetic circuits in all of the prior art structures results in significant degradation of the magnetic field strength within the magnetic circuit.

Referring again to the prior art structures, the self-defined structures found in all of the prior art are limited as to having dielectric material that is inherently not under the external influence of a strong magnetic field. The characteristic of their magnetic electrodes that span the breadth of such structures results in none, or only a modest amount of the magnetic flux of such structures passing through the dielectric between electrodes, and/or to have such magnetic flux that does pass through the dielectric between the electrodes to be of comparatively weakened field strength.

Some of the prior art capacitor structures are designed to specifically utilize magnetic material components as electrodes in order to derive gigantic magnetoresistance effects (GMR) so as to beneficially reduce current tunneling through the dielectric from the charged electrodes. Some of these prior art devices' incorporation of a GMR effect does allow for the beneficial use of comparatively thinner dielectric layers and thus smaller volumes of capacitors relative to the geometric equivalent performance of traditional capacitors of non-GMR structures, as to providing for comparable retained charge, because the GMR effect inhibits the occurrence of tunneling current. However, these prior art GMR-effect-inducing capacitor structures do not increase greatly the capacitance or energy density of a capacitor because such prior art GMR structures do not provide for an enhanced polarization potential of the dielectric material, since such prior art's magnetic structures span the entire device, their magnetic flux circuitries follow a path that is stray to and outside of the dielectric within their capacitor. That is to say, the prior art structures do not derive the dramatic increase in energy density of a capacitor.

Following is an analysis of some example prior art constructions with illustrations and matching narrative explanations of the operation of their magnetic circuitry and the inherent flaws associated with such prior art structures, which flaws contribute to the reasons that inhibit such prior art devices from achieving significant gains in energy density. Referring to FIG. 4, shown is a three dimensional perspective view of an example prior art magnetic capacitor structure 40, which consists of a top plate 42 made of magnetic material(s) with a dipole orientation horizontal to the plane in one direction, a bottom plate 44 made of magnetic material(s) with a dipole orientation to the plane in the same direction (i.e., parallel magnetism), with a dielectric layer 46 sandwiched between the top 42 and bottom 44 magnetic layers. The top 42 and bottom 44 magnetic layers are opposite electrical polarity electrodes (e.g. positive/ negative). In this illustration, the vertical distance between the magnetic electrode plates 42, 44 is comparatively shorter than the horizontal distance across the magnetic electrode plates. The capacitance of a structure is inversely proportional to the distance between the electrodes, whereas the capacitance increases with increased surface areas of the electrodes, and hence the vertical distance between electrodes is typically kept small relative to the plate dimensions.

With a parallel magnetic dipole orientation of the top versus the bottom electrode plate, as shown in FIG. 4, much, if not most of the flux will follow an arc shaped magnetic circuit emanating first in plane from the tips of the dipole and then bending from the opposing polarity dipole ends of one magnetic electrode towards the other opposing dipole end of the same magnetic electrode in a horizontal direction, with most of the flux passing either across the top of the top electrode or across the bottom of the bottom electrode, because the path through the dielectric layer between the magnetic electrodes is conflicted and constrained as to density potential because flux lines cannot cross each other and the easiest non-conflicting pathway is outside the structure. Therefore much of the flux circuit will be completely stray to the structure and the flux will be caused to travel outside the dielectric layer that is sandwiched between the two electrodes, and the magnetic flux circuit will also travel stray to the electric field that passes across the dielectric layer, which electric field is aligned orthogonally from one electrode to the other electrode. Additionally, since the magnetic circuit of the flux requires a return path that is equal to the width distance of the electrode plate, the magnetic field strength is significantly weakened compared to the field strength of the much shorter vertical distance between the opposing dipole ends of an anti-parallel magnetic electrode configuration, as described below in association with FIG. 5. Thus, with a parallel magnetic dipole orientation of electrodes, most of the flux is completely stray to the capacitor and also exhibits a comparatively weak magnetic field influence, both undesirable features for achieving magnetically enhanced energy density within a capacitor. Furthermore, if the dimensional size of the magnetic electrode plates is increased in an attempt to provide for greater total energy storage capacity, inherently, the magnetic circuit traveling across the high reluctance medium between the dipole ends of the magnets will increase in length and the magnetic field strength would thus decrease exponentially with the increased distance. Such prior art magnetic electrode structures are not capable of scaling to larger dimensions while retaining magnetic field strength influence.

FIG. 5 shows a three dimensional perspective view of an example prior art magnetic capacitor structure 50, which consists of a top plate 52 made of magnetic material(s) with a dipole orientation horizontal to the plane in one direction, a bottom plate 54 made of magnetic material(s) with a dipole orientation horizontal to the plane in the opposite direction to the top plate (i.e., anti-parallel magnetism), with a dielectric layer 56 sandwiched between the top 52 and bottom magnetic layers 54. The top 52 and bottom 54 magnetic layers are opposite electrical polarity electrodes (e.g. positive/negative). In this illustration, the vertical distance between the magnetic electrode plates 52 and 54 is comparatively shorter than the horizontal distance across the magnetic electrode plates. The capacitance of a structure is inversely proportional to the distance between the electrodes, whereas the capacitance increases with increased surface areas of the electrodes, hence this vertical distance between electrodes is typically kept small relative to the plate dimensions.

With an anti-parallel magnetic dipole orientation of the top versus the bottom electrode plate as shown in FIG. 5, much, if not most of the flux will follow an arc shaped magnetic circuit emanating first in plane from the tips of the dipole and then bending from the opposing polarity dipole ends of one magnetic electrode towards the other opposing dipole end of the other magnetic electrode in a vertical direction. Therefore much of the flux circuit will follow a path that is stray to the structure, that is to say, the flux will be caused to travel outside the dielectric layer that is sandwiched between the two electrodes, and the magnetic flux circuit will also travel stray to the electric field that passes across the dielectric layer, which electric field is aligned orthogonally from one electrode to the other electrode. Therefore, such prior art structures do not permit the beneficial influence of a magnetic field working in conjunction with the electric field influence to realize a meaningful magnetically enhanced capacitance effect.

Referring now to FIGS. 6A and 6B, shown are side elevation schematic views of example prior art structures 60 (e.g., 60A and 60B), which consists of a top plate 62 made of magnetic material(s) with a dipole orientation horizontal to the plane in one direction, a bottom electrode 64 (e.g., 64A of FIG. 6A and 64B of FIG. 6B) made of discrete magnetic material(s) with a dipole orientation to the plane in the same direction (i.e., parallel magnetism, FIG. 6A), and alternatively in the opposite direction (i.e., antiparallel magnetism, FIG. 6B), with a dielectric layer 66 sandwiched between the top 62 and bottom 64 magnets. The top 62 and bottom 64 magnetic layers are opposite electrical polarity electrodes (e.g. positive/negative). In this illustration, the vertical distance between the magnetic electrode plates 62 and 64 is comparatively shorter than the horizontal distance across the magnetic electrode plates. The capacitance of a structure is inversely proportional to the distance between the electrodes, whereas the capacitance increases with increased surface areas of the electrodes, hence this vertical distance between electrodes is typically kept small relative to the plate dimensions.

Albeit the bottom magnets 64 shown in FIGS. 6A and 6B are discrete, their magnetic coupling results in a flux circuitry that is comparable to a single plate because the discrete magnets link in series. Therefore the comments of the two prior art discussions (FIGS. 4-5) for the most part apply to these structures.

With a parallel magnetic dipole orientation of the top electrode plate 62 versus the bottom electrode plate 64 (FIG. 6A), much, if not most of the flux will follow an arc shaped magnetic circuit emanating first in plane from the tips of the dipole and then bending from the opposing polarity dipole ends of one magnetic electrode towards the other opposing dipole end of the same magnetic electrode in a horizontal direction, with most of the flux passing either across the top of the top electrode 62 or across the bottom of the bottom electrode 64, because the path through the dielectric layer 66 between the magnetic electrodes 62, 64 is conflicted and constrained as to density potential because flux lines cannot cross each other and the easiest non-conflicting pathway is outside the structure 60. Therefore much of the flux circuit will be completely stray to the structure 60 and the flux will be caused to travel outside the dielectric layer 66 that is sandwiched between the two electrodes 64, 62, and the magnetic flux circuit will also travel stray to the electric field that passes across the dielectric layer 66, which electric field is aligned orthogonally from one electrode to the other electrode. The flux between the gaps of the discrete magnets will have comparatively moderate magnetic field strength weakening because the distance is relatively short, whereas, since the magnetic circuit of the flux of the top magnet and the flux return path of the outer magnets of the bottom electrode requires a return path that is equal to the width distance of the electrode plate, the magnetic field strength is significantly weakened compared to the field strength of the much shorter vertical distance between the opposing dipole ends of an anti-parallel magnetic electrode configuration. Thus, with a parallel magnetic dipole orientation of electrodes, most of the flux is completely stray to the capacitor and also exhibits a comparatively weak magnetic field influence, both undesirable features for achieving magnetically enhanced energy density within a capacitor. Furthermore, if the dimensional size of the magnetic electrode plates is increased in an attempt to provide for greater total energy storage capacity, inherently, the magnetic circuit traveling across the high reluctance medium between the dipole ends of the top magnet and the outer magnets of the bottom electrode will increase in length and the magnetic field strength would thus decrease exponentially with the increased distance. Therefore, such magnetic electrode structures are not well adapted towards scaling to larger dimensions while retaining magnetic field strength influence.

With an anti-parallel magnetic dipole orientation of the top versus the bottom electrode plate (FIG. 6B), much, if not most of the flux will follow an arc shaped magnetic circuit emanating first in plane from the tips of the dipole and then bending from the opposing polarity dipole ends of one magnetic electrode 62 towards the other opposing dipole end of the other magnetic electrode 64 in a vertical direction. Therefore much of the flux circuit will follow a path that is stray to the structure 60, that is to say, the flux will be caused to travel outside the dielectric layer 66 that is sandwiched between the two electrodes 62, 64, and the magnetic flux circuit will also travel stray to the electric field that passes across the dielectric layer 66, which electric field is aligned orthogonally from one electrode to the other electrode. The flux that bridges between the dipole ends of the discrete magnets likewise lies outside the electric field between the electrodes. Therefore, such prior art structures do not permit the beneficial influence of a magnetic field working in conjunction with the electric field influence to realize a meaningful magnetically enhanced capacitance effect.

The two illustrations in FIGS. 7A-7B provide representative side-elevation and perspective schematic views, respectively, of example prior art structures 70, which consists of a top plate 72 made of magnetic material(s) with an dipole orientation that is perpendicular to the plane of the top plate 72 and opposing but parallel to the perpendicular anisotropy to the plane of the bottom plate 74 made of magnetic material(s) with a dielectric layer 76 sandwiched between the top and bottom magnetic layers 72, 74. The top 72 and bottom 74 magnetic layers are opposite electrical polarity electrodes (e.g. positive/negative). In these illustrations the vertical distance between the magnetic electrode plates 72, 74 is comparatively shorter than the horizontal distance across the plane of the magnetic electrode plates. The capacitance of a structure 70 is inversely proportional to the distance between the electrodes 72, 74, whereas the capacitance increases with increased surface areas of the electrodes, hence this vertical distance between electrodes is typically kept small relative to the in plane plate dimensions.

With an opposing magnetic dipole orientation of the top 72 versus the bottom 74 electrode plate, the flux will pass perpendicular to the plane of the electrodes and across the dielectric material 76 sandwiched between the magnetic electrodes. But the flux will also be caused to follow a magnetic circuit that will follow an arc shaped magnetic path emanating from the top of the top magnetic electrode plate 72 completely outside of the capacitor structure around to the opposing dipole bottom surface of the bottom electrode 74, which outside arc path becomes larger as the magnetic electrode plate dimensions grow larger. Additionally, this lengthy outer arced magnetic circuit of the flux is significantly weakening to the field strength. Therefore such structures will not scale to larger dimensions as to retaining magnetically enhanced capacitance effect.

Referring to FIG. 8, shown is a three dimensional perspective view of an example prior art magnetic capacitor structure 80, which consists of a top plate 82 made of magnetic material(s) with an in-plane dipole orientation and a bottom plate 84 made of non-magnetic material(s) with a dielectric layer 86 sandwiched between the top magnetic electrode layer 82 and the bottom non-magnetic electrode layer 84. The flux of the sole magnetic electrode 82 will be caused to follow a magnetic circuit that will follow twin arc shaped magnetic circuits emanating from the north pole of the top magnetic electrode plate 82 with one arc path transcending across the top of the top magnetic electrode 82 completely outside and thus stray of the capacitor structure 80 and the other arced path transcending through the dielectric material 86 and/or the non-magnetic electrode 84, toward the opposing dipole of the top magnetic electrode 82, which arc shaped magnetic circuit paths becomes longer as the magnetic electrode plate 82 dimensions grows larger. Additionally, this lengthy arced magnetic circuit of the flux is significantly weakening to the field strength. Thus, this structure has two inherent flaws as to yielding strong magnetic influence to a capacitor: weak field strength and half the flux stray to the capacitor which reduces flux density.

FIG. 9 shows a three dimensional perspective view of an example prior art magnetic capacitor structure 90, which consists of a top plate 92 made of non-magnetic conductive material(s) and a bottom plate 94 with non-magnetic conductive material(s). Also there is a magnetic plate 96 that has an in-plane dipole orientation, which magnetic plate 96 spans the entire dimension of the capacitor structure 90, with dielectric layers that are sandwiched between the top and the bottom non-magnetic conductive plates 92 and 94 and the magnetic plate 96. The dielectric layers conductively isolate the magnetic plate 96. The flux of the sole magnetic plate 96 will be caused to follow a magnetic circuit that will follow twin arc shaped magnetic circuits emanating from the north pole of the sandwiched magnetic plate 96 with one arc path transcending over the top of the top magnetic plate and the other arced path transcending over the bottom of the magnetic plate, with such flux passing through the dielectric material 96 and/or the non-magnetic electrode, or outside and stray of the capacitor structure, toward the opposing dipole of the magnetic plate. As the magnetic electrode plate dimensions grow larger, the arc shaped magnetic circuit pathway through high reluctance materials becomes longer. This lengthy arced magnetic circuit of the flux is significantly weakening to the field strength. Thus, this structure has at least two inherent flaws as to yielding strong magnetic influence to a capacitor as the flux path will not scale well to larger dimensions of capacitor structures and the arced flux return path where the flux density is greatest near the dipole ends will be largely stray to the capacitor structure, especially if the vertical dimension is kept narrow between the two non-magnetic conductor plate terminals of the capacitor.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A-1C are schematic diagrams that illustrate an example prior art magnetic capacitor structure.

FIGS. 2A-2B are schematic diagrams that illustrate another example prior art magnetic capacitor structure.

FIG. 3 is a schematic diagram that illustrates another example prior art magnetic capacitor structure.

FIGS. 11A-11C are schematic diagrams that illustrate an embodiment of an example magnetically enhanced energy storage (MEES) device.

FIGS. 14A-14C are schematic diagrams that illustrate an embodiment of an example MEES device.

FIGS. 15A-15B are schematic diagrams that illustrate an embodiment of an example MEES device comprising one type of encapsulation of the magnets.

FIGS. 16A-16B are schematic diagrams that illustrate an embodiment of an example MEES device comprising another type of encapsulation of the magnets.

FIG. 17 is a schematic diagram that illustrates an embodiment of an example stack-up for the MEES device shown in FIGS. 14A-14C.

FIG. 18 is a schematic diagram that illustrates an example configuration for an embodiment of an example MEES device.

FIGS. 19A-19D are schematic diagrams that illustrate an embodiment of an example MEES device comprising discrete magnets with different configurations for the manner of coupling the magnets.

DESCRIPTION OF EXAMPLE EMBODIMENTS

Overview

Figure 4:
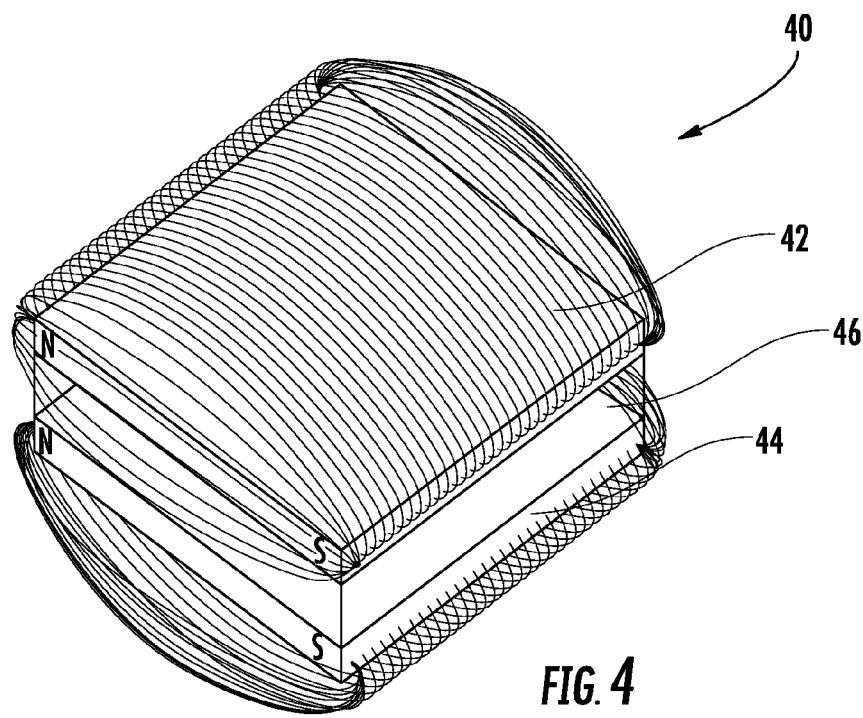
FIG. 4 is a schematic diagram that illustrates an example prior art magnetic capacitor structure comprising top and bottom parallel magnetic electrode plates.
Figure 5:
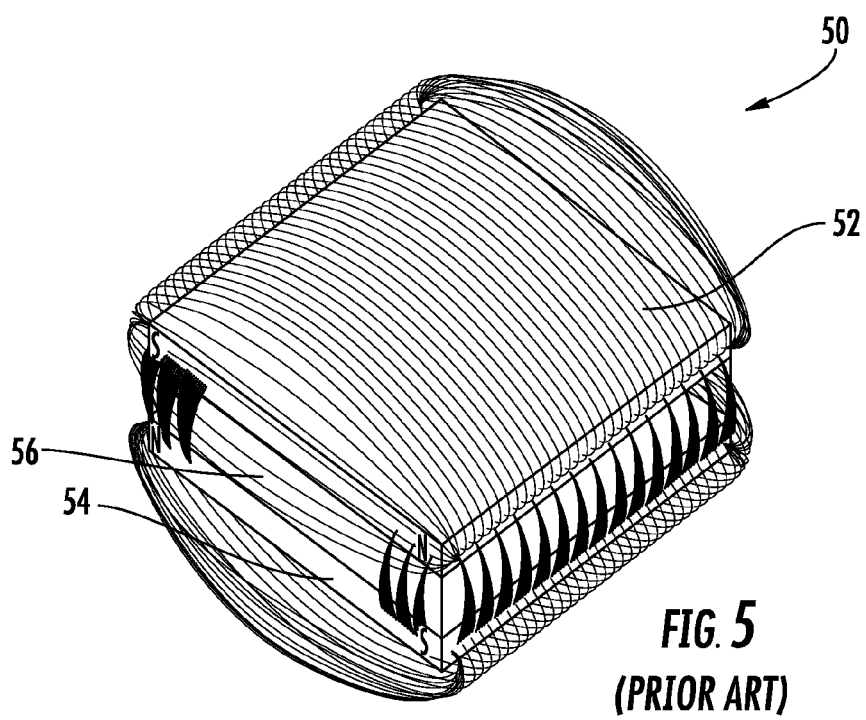
FIG. 5 is a schematic diagram that illustrates an example prior art magnetic capacitor structure comprising top and bottom anti-parallel magnetic electrodes (FIG. 8).
Figure 6A:
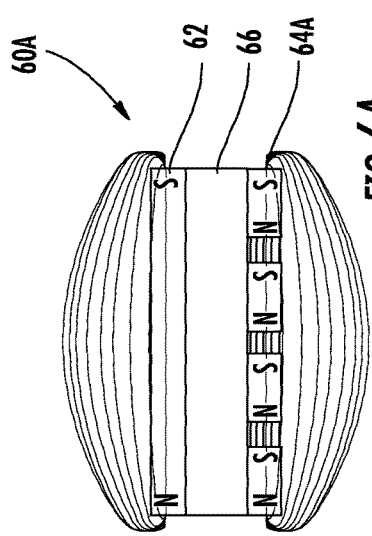
FIGS. 6A-6B are schematic diagrams that illustrate an example prior art magnetic capacitor structure with a top magnetic plate electrode with discrete magnets as the bottom electrode in parallel and anti-parallel dipole orientation.
Figure 6B:
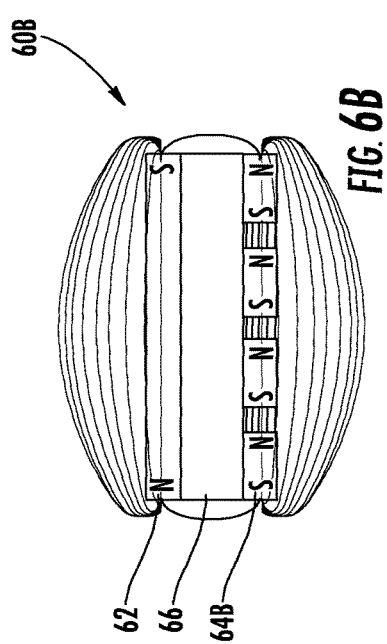
Figure 7A:
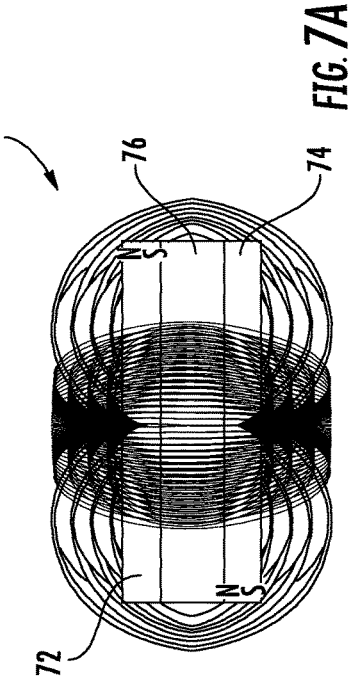
FIGS. 7A-7B are schematic diagrams that illustrate an example prior art magnetic capacitor structure comprising top and bottom (dipole orientation perpendicular to a plane) magnetic electrode plates.
Figure 7B:
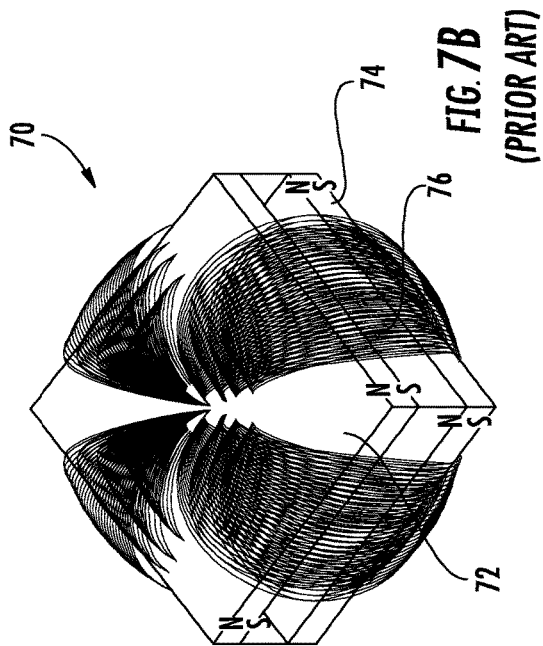
Figure 8:
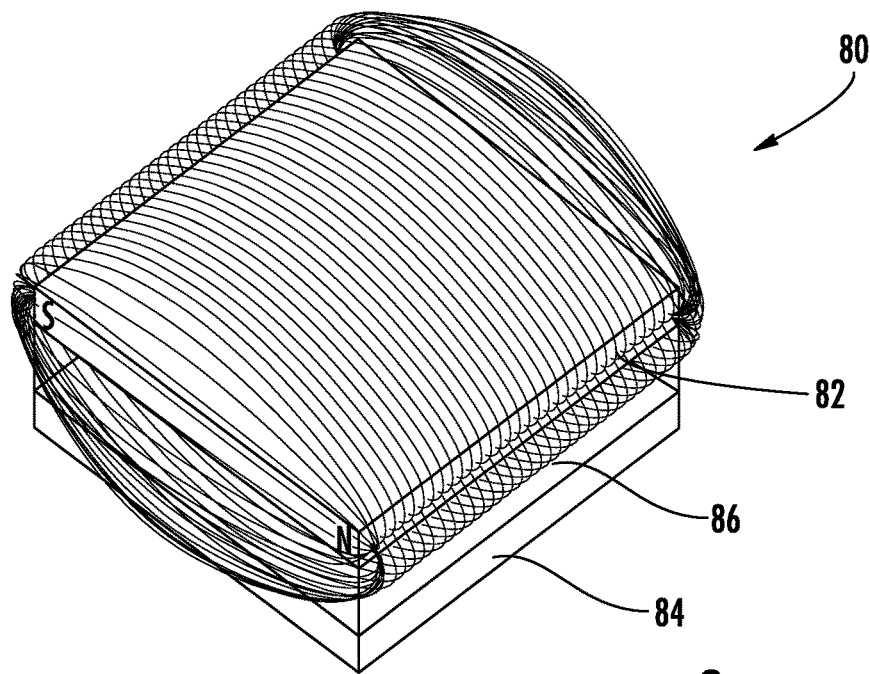
FIG. 8 is a schematic diagram that illustrates an example prior art magnetic capacitor structure comprising a single magnetic electrode plate with a non-magnetic electrode plate.
Figure 9:
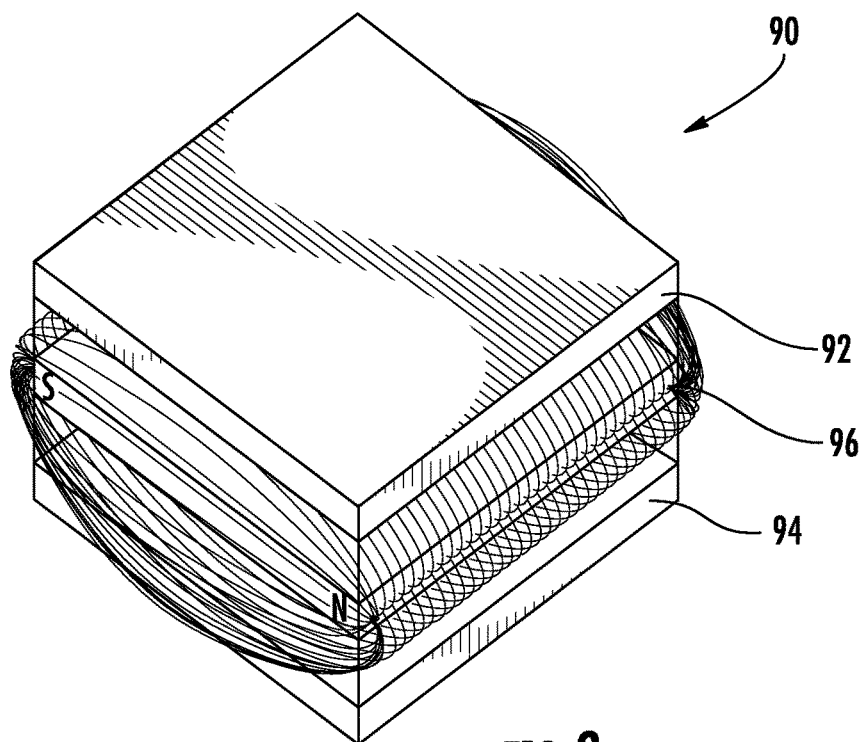
FIG. 9 is a schematic diagram that illustrates an example prior art magnetic capacitor structure comprising two non-magnetic electrode plates and a sandwich of dielectric layers with a single magnetic layer.

In one embodiment, a system, comprising: a first non-magnetic conductive electrode; a second non-magnetic conductive electrode; a dielectric layer disposed between the first and second electrodes, the dielectric layer extending between the first and second electrodes; and first and second layers comprising plural pairs of magnetically coupled pairings of discrete magnets, the first and second layers separated by a non-magnetic material, wherein the magnets of at least the first layer are conductively connected to the first non-magnetic conductive electrode.

Detailed Description

Without being bound or limited by any theory as to the cause or derivation of effect, certain embodiments of an invention comprising magnetically enhanced energy storage (MEES) systems, devices, and methods are disclosed that utilize a combination of physical effects to realize an increase in the energy density of a capacitor, with a basis in operation including one or more of the following: (a) a dielectric reacts separately and independently to the external influences of an electric field and that of a magnetic field, with such a dielectric reacting in combination to such external field force influences; and (b) additionally, the influence of a strong magnetic force on an electrode that stores the charge of electrons of a capacitor can also greatly increase the density of states of electron orbits at the interface of the electrode and the dielectric and therefore provides for enhanced occupancy of electrons (e.g., increased charge) on that electrode Therefore under the combined application of extrinsic influences of an electric field and magnetic field forces of certain embodiments of MEES systems and methods, electrodes and the dielectric of a capacitor can be caused for beneficial effect to have the capacity for dramatically greater energy storage density, with such density definable in terms of super colossal quantum capacitance.

For reasons that will become clear in the following description, in comparison to the prior art structures described above, certain embodiments of MEES systems retain all, or predominantly all of the beneficial magnetic flux within the capacitor structure so as to avail the magnetic flux's influence over the energy levels of the electron orbits to provide beneficial enhancement of energy density inside of MEES systems, such as MEES devices. Additionally, or alternatively, certain embodiments of MEES systems provide for increasing the dimensional size of a magnetically enhanced energy storage device of the present disclosure while simultaneously avoiding diminishment of the magnetic field strength, thereby providing for ready scalability of the energy storage device's functionality in achieving extraordinary energy density.

Digressing briefly, dielectrics are insulators with the quality to be "polarized" by an applied electric field. Because of dielectric polarization, positive charges in atoms (or of entire molecules) are displaced toward the field and negative charges shift in the opposite direction, away from the field. At the atomic level the spin coupling interaction of the electrons can be shifted so as to have their orbits altered by alignment with the force of the electric field. This polarization of the dielectric in turn creates an internal electric field which reduces the overall field within the dielectric itself and across the span between the electrodes of a capacitor. The degree of polarizability is expressed by a number called a dielectric constant. The manifestation of such polarization/spin orbit interaction effect of an external electric field force is called the Stark Effect. According to quantum theory, the effect of the electric field force on the electron orbit is to split each energy level of the principal quantum number n into 2n−1 equidistant levels of separation proportional to the electric field strength.

Figure 10A:
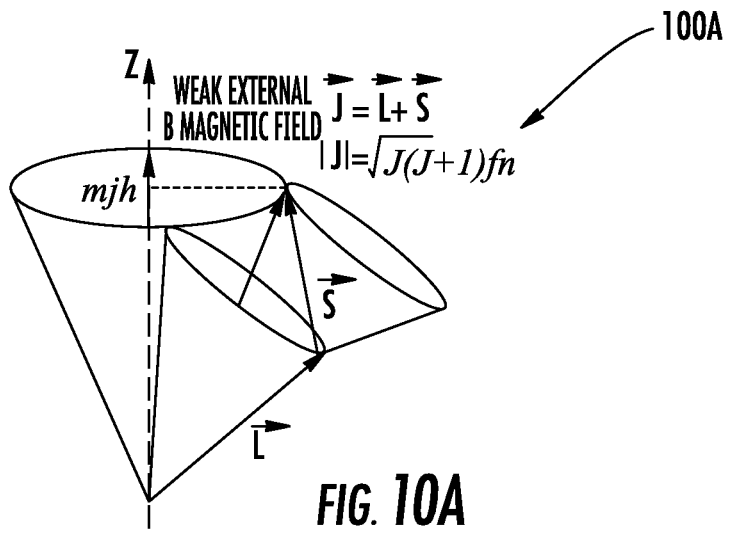
FIGS. 10A-10B are schematic diagrams of example vector models, with the upper diagram corresponding to a weak external magnetic field case and the lower diagram corresponding to a strong external magnetic field case.
Figure 10B:
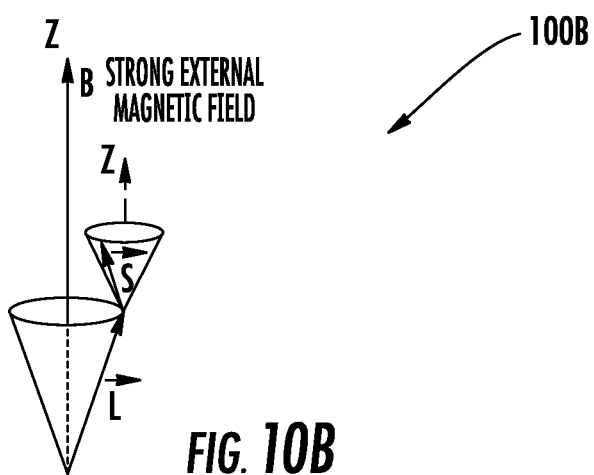

An analogue of the Stark Effect is the Zeeman Effect (or the Paschen-Back Effect), whereby in the presence of an applied magnetic field, the energy levels of atoms are split. If the magnetic field is sufficiently weak the splitting is small compared to the energy difference between the unperturbed levels and is called the Zeeman Effect. In the weak field case, the vector model 100A illustrated in FIG. 10A implies that the coupling of the orbital angular momentum L to the spin angular momentum S is stronger than their coupling to the external magnetic field B. In this case where spin-orbit coupling is dominant, they can be visualized as combining to form a total angular momentum J which then precesses about the magnetic field direction. L and S are not separately conserved, only the total angular momentum J=L +S is conserved, which is indicated by the arrow forming the edge of the large precessing cone centered about the magnetic field. The spin and orbital angular momentum vectors can be thought of as precessing about the (fixed) total angular momentum vector J. That is, from FIG. 10A, it is evident that the two independent precessing momentum cones combine to become one cone that is torqued to align closer to the magnetic field (B), where the L and S cone discontinue and the J cone results. The (time-)"averaged" spin vector is then the projection of the spin onto the direction of J. Whereas the Paschen-Back Effect occurs in the strong-field case, as illustrated by the model 100B in FIG. 10B, whereby S and L couple more strongly to the external magnetic field than to each other, and can be visualized as independently precessing about the external field direction. This effect is the strong-field limit of the Zeeman Effect.

The magnetic quantum number determines the energy shift of an atomic orbital due to the influence of an external magnetic field, hence the name magnetic quantum number (e.g., Zeeman Effect). However, the actual magnetic dipole moment of an electron in an atomic orbital arrives not only from the electron angular momentum, but also from the electron spin, expressed in the spin quantum number. In atomic physics, the magnetic quantum number is the third of a set of quantum numbers (the principal quantum number, the azimuthal quantum number, the magnetic quantum number, and the spin quantum number), the magnetic quantum number describing the unique quantum state of an electron and is designated by the letter m. The magnetic quantum number denotes the energy levels available within a subshell.

There are a set of quantum numbers associated with the energy states of the atom. The four quantum numbers n, l, m, and s specify the complete and unique quantum state of a single electron in an atom called its wave function or atomic orbital. The wave function of the Schrodinger equation reduces to the three equations that when solved lead to the first three quantum numbers. Therefore, the equations for the first three quantum numbers are all interrelated. The magnetic quantum number arose in the solution of the azimuthal part of the wave equation.

The magnetic quantum number associated with the quantum state is designated as m. The quantum number m refers, loosely, to the direction of the angular momentum vector. The magnetic quantum number m does not affect the electron's energy, but it does affect the electron cloud. Given a particular l, m is entitled to be any integer from −l up to l. More precisely, for a given orbital momentum quantum number l representing the azimuthal quantum number associated with angular momentum), there are 2l+1 integral magnetic quantum numbers m ranging from −l to l, which restrict the fraction of the total angular momentum along the quantization axis so that they are limited to the values m. This phenomenon is known as space quantization. Since each electronic orbit has a magnetic moment in a magnetic field, the electronic orbit will be subject to a torque which tends to make the vector L parallel to the magnetic field. The precession of the electronic orbit in a magnetic field is called the Larmor precession.

To describe the magnetic quantum number m one begins with an atomic electron's angular momentum, L, which is related to its quantum number l by the following equation:

$$L = \hbar\sqrt{l(l+1)}$$

where ℏ=h/2π is the reduced Planck constant. The energy of any wave is the frequency multiplied by Planck's constant. This causes the wave to display particle-like packets of energy called quantum. To show each of the quantum numbers in the quantum state, the formulae for each quantum number include Planck's reduced constant which only allows particular or discrete or quantized energy levels.

To show that only certain discrete amounts of angular momentum are allowed, l has to be an integer. The quantum number m refers to the projection of the angular momentum for any given direction, conventionally called the z direction. $L_z$, the component of angular momentum in the z direction, is given by the formula:

$$L_z = m\hbar.$$

Another way of stating the formula for the magnetic quantum number ($m_l = -l, -l+1, \ldots, 0, \ldots, l-1, l$) is the eigenvalue, $J_z = m_e h/2\pi$.

The energy stored in a capacitor is calculated to be:

$$E = \tfrac{1}{2} C V^2,$$

where E is energy, C is capacitance and V is voltage.

Capacitance can be calculated if the geometry of the conductors and the dielectric properties of the insulator between the conductors are known. For example, the capacitance of a parallel-plate capacitor constructed of two parallel plates both of area A separated by a distance d is approximately equal to the following:

$$C = \varepsilon_r \varepsilon_0 \frac{A}{d}$$

Where C is the capacitance; A is the area of overlap of the two plates; $\epsilon_r$ is the relative permittivity (sometimes called the dielectric constant) of the material between the plates (for a vacuum, $\epsilon_r=1$); $\epsilon_0$ is the permittivity of vacuum ($\epsilon_0 \approx 8.854 \times 10^{-12}$ F m$^{-1}$); and d is the separation between the plates.

Capacitance is proportional to the area of overlap and inversely proportional to the separation between conducting sheets. The closer the sheets are to each other, the greater the capacitance. The equation is a good approximation if d is small compared to the other dimensions of the plates so the field in the capacitor over most of its area is uniform, and the so-called fringing field around the periphery provides a small contribution.

Having described some underlying physics involved in certain embodiments of MEES systems, the following description is directed to several differences between the prior art structures and one or more embodiments of example structures of magnetically enhanced energy storage devices, or generally, MEES systems. In general, certain embodiments of MEES systems are differentiated from all of the prior art in that the magnetic materials do not contiguously span the breadth of the entire device (wherein at least one magnet layer in the prior art spans the entire device). Instead, the magnetic materials are patterned into discrete magnetic structures configured to amplify magnetic flux intensity while retaining the magnetic field strength by minimizing opposing pole distances and creating an unexpected extraordinary increase in energy density, regardless of dimensional scale of the entire device.

One reason the magnetically enhanced energy storage devices of certain embodiments of MEES systems depart from the prior art is because the magnetic circuitry is designed to be fully encompassed within the device's electric field so as to provide for the magnetic field and the electric field to work in conjunction with each other for unexpected, synergistic effect, and such containment of the magnetic circuitry provides for a resultant unanticipated super colossal gain in energy density effect. MEES systems and methods utilize distinct structural designs that are proven to trigger a super colossal magnetic capacitance effect (sCMC) which unique combined effects derive dramatically enhanced energy storage density far beyond what would be anticipated by the individual components of the composite structure. The sCMC effect is especially remarkable and unexpected given that such effect may occur while using SiO2 as a dielectric material, which material is not known for having magnetocapacitive properties such as the rare earth manganites, or for example, CuCaTiO3. Furthermore SiO2 is on a comparative basis a material of a rather low dielectric constant, having a K value of 3.9, yet testing of a structure of an embodiment of a MEES system has yielded capacitance values ranging from 25,000 to exceeding 70,000 times the value of a non-magnetically enhanced structure using SiO2. Certain embodiments of MEES systems provide a composite structure that derives an unanticipated and extraordinary colossal gain in energy storage density.

Having summarized certain features of MEES systems of the present disclosure, reference will now be made in detail to the description of the disclosure as illustrated in the drawings. While the disclosure will be described in connection with these drawings, there is no intent to limit it to the embodiment or embodiments disclosed herein. For instance, MEES systems with an anti-parallel dipole orientation of upper and lower magnets are of primary focus in the description that follows, with the understanding that in some embodiments, a parallel dipole orientation may be deployed.

Further, though the description refers to examples of upper and lower structures, it is not intended that the orientation of the structures be of a vertical relation, and that other orientations with the same or similar structure are contemplated to be within the scope of the disclosure. Further, although the description identifies or describes specifics of one or more embodiments, such specifics are not necessarily part of every embodiment, nor are all various stated advantages necessarily associated with a single embodiment or all embodiments. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set forth in the description. It is noted that in the drawings that follow, illustrations of the flux are for demonstrative purposes, and that the quantity or extent of fluxes may be of a much considerable density and/or strength than that perceived from the drawings.

The illustration in FIGS. 11A show a three dimensional, cutaway, perspective schematic view (and FIGS. 11B and 11C show side elevation and top schematic views, respectively) of an embodiment of a magnetically enhanced energy storage (MEES) device 110. One embodiment of a MEES device structure 110 (e.g., 110A, 1108, and 110C), as shown in FIGS. 11A-11C comprises a substrate 112 (e.g. a silicon wafer, a piece of glass, etc.), an optional dielectric/insulative layer 114 disposed on the substrate 112 to insulate the MEES from the conduction to the substrate, a non-magnetic conductive electrode layer 116 (e.g., aluminum, copper, etc.) disposed on the layer 114, a pattern of discrete magnets 120 (lower) conductively attached to the lower conductive, electrode layer 116, a dielectric 122 that encapsulates the dipole ends of the lower magnets 120 and upper magnets 124 and that continues as a filling layer between the discrete magnets 120 and 124, the upper pattern of discrete magnets 124 whose dipole orientation is anti-parallel to the lower pattern of discrete magnets 120, which upper discrete magnets 124 are conductively connected to an upper conductive plate 126. In some embodiments, the encapsulation (embedding) of all or a portion of the magnets 120 and 124 may be entirely (e.g., all surfaces of each magnet, and in a sense, "floating" within the dielectric) within the dielectric 122. In some embodiments, all or a portion of the magnets 120 and 124 may be partially embedded within the dielectric 122 (e.g., all surfaces of a magnet may be encapsulated except the surface adjacent the respective conductive electrode, the majority of the magnet is encapsulated within the dielectric, etc.).

Figure 12A:
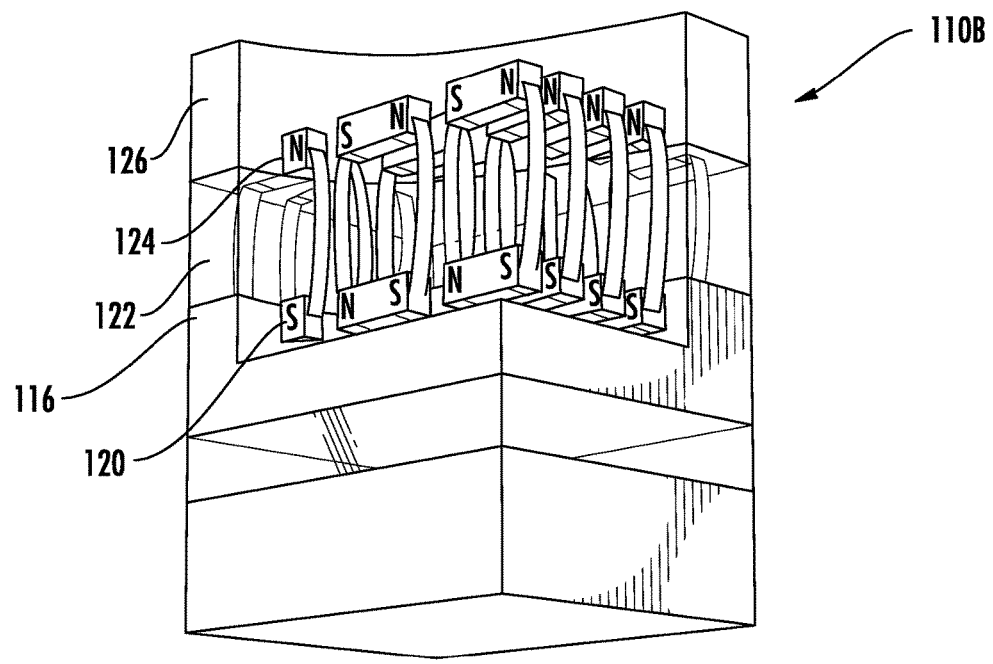
FIGS. 12A-12B are schematic diagrams that illustrate an embodiment of an example MEES device comprising discrete magnets partially embedded into their respective conductive electrode plates.
Figure 12B:
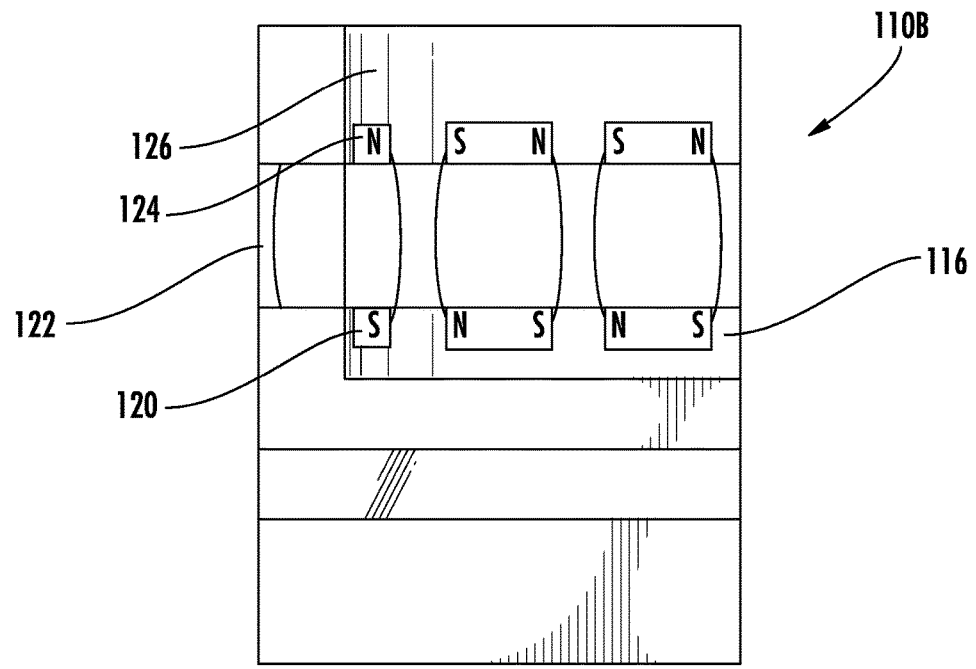

An alternative embodiment 1108 to the above design includes discrete magnets 120 and 124 that are partially embedded into their respective conductive electrode plates 116 and 126, as illustrated in FIGS. 12A (perspective view) and 12B (side elevation view). Similar to the discussion above with regard to the dielectric encapsulation or embedding, in some embodiments, the encapsulation of all or a portion of the magnets 120, 124 may be entirely (e.g., all surfaces of each magnet) within the respective electrode 116, 126. In some embodiments, all or a portion of the magnets 120, 124 may be partially embedded within the respective electrode 116, 126 (e.g., all surfaces of a magnet may be encapsulated by the electrode except the surface adjacent the dielectric 122, the majority of the magnet is encapsulated within the electrode, etc.). In some embodiments, the extent of encapsulation (or absence of encapsulation) may be different between the magnets associated with the "top" electrode 126 in FIG. 12 and the magnets associated with the "bottom" electrode 116 in the same figure.

Note that in certain embodiments, reference to an electrode refers to a conductive layer that is magnetic and/or non-magnetic and which is subject to an applied electric force of a defined polarity.

Figure 13:
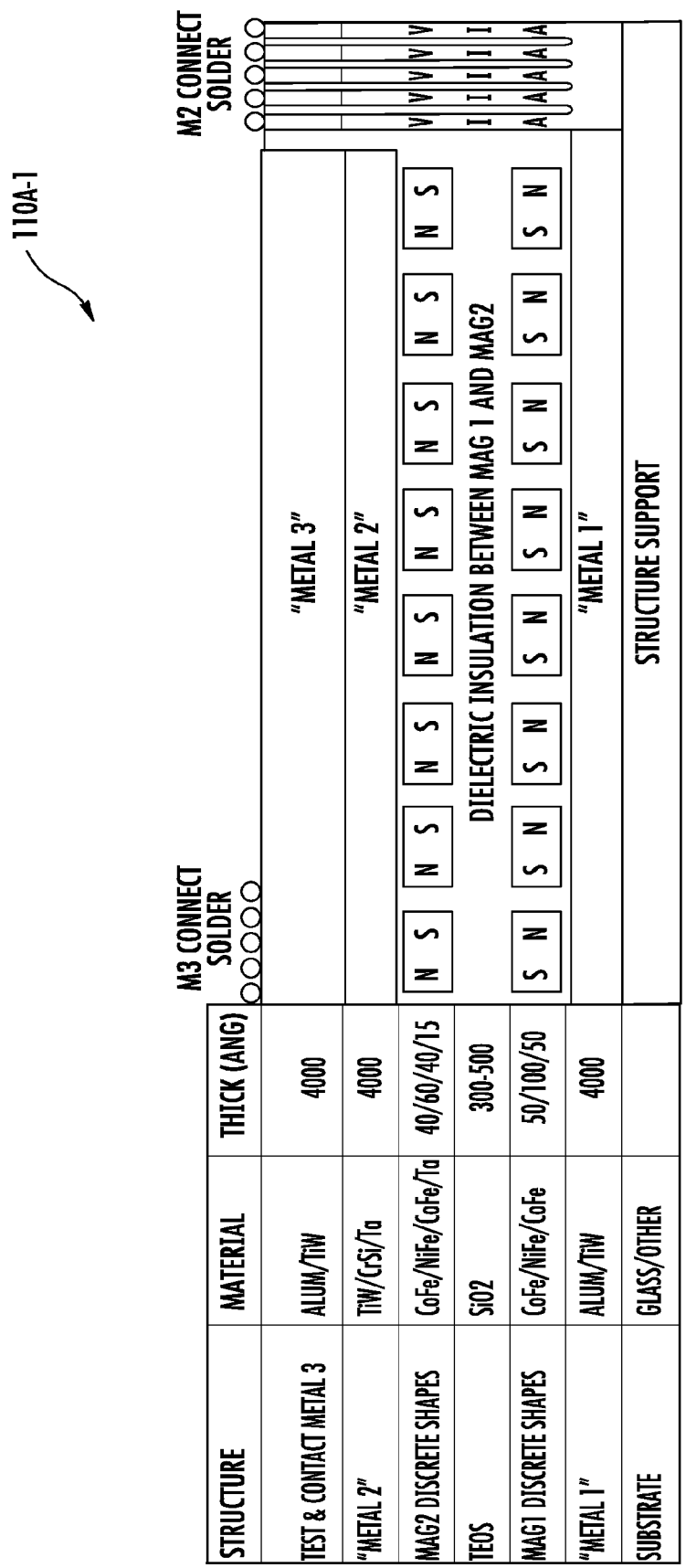
FIG. 13 is a schematic diagram that illustrates an embodiment of an example stack-up for the MEES device shown in FIGS. 11A-11C.

One embodiment of an example stack-up 110A-1 for the design 110A shown in FIG. 11 (e.g., 11A) may be as illustrated in FIG. 13. It should be appreciated by one having ordinary skill in the art, within the context of the present disclosure, that the configuration (e.g., composition of material(s) and/or thicknesses) illustrated in FIG. 13 are for illustrative purposes, and that some embodiments may use different and/or other materials and/or thickness dimensions and arrangements.

A further enhanced embodiment, depicted as MEES device 140A in FIGS. 14A-14C, includes a magnetic field influence and magnetic flux circuit, which is brought towards one of the conductive electrodes 142. In one embodiment, the structure of the MEES device 140A comprises a substrate 144 (e.g. a silicon wafer, a piece of glass, etc.), an optional dielectric/insulative layer 146 disposed on the substrate 144, a non-magnetic conductive electrode layer 148 (e.g., aluminum, copper, etc.) disposed on the layer 146, a dielectric 152, pattern of discrete lower 154 and upper 156 magnets at least partially embedded in the dielectric 152, and the upper conductive electrode 142. The design shown in FIGS. 14A-14C can becomes a polar magnetically enhanced energy storage device, whereby the conductive electrode 142 with conductively attached pattern of discrete magnets 154, 156 is the plate onto which electrons are stored when the device is charged by a charging circuit. The encapsulation within the dielectric may be fully for all or a portion of the magnets 154, 156, or partially in similar manner to that described above for FIGS. 11-12. Note that in some embodiments, the charging circuit may be positively coupled to the plate where there are no magnets conductively connected (e.g., the bottom plate 148 in FIG. 14A). This structure 140A (in FIGS. 14A-14C) differs even more extensively from the prior art as it provides for stronger magnetic field potential because the vertical flux return gap from the dipole ends of the anti-parallel dipole orientation of the discrete magnets 154, 156 are much closer than if the discrete magnets were to have their flux paths span across the entire dielectric material between the top (e.g., positive) conductive electrode plate 142 and the bottom (e.g., negative) conductive electrode plate 148, as illustrated in association with the embodiments described above for FIGS. 14A-14C. This design may be favored from, for instance, a manufacturability standpoint as it would not result in electrical shorting across the dielectric between the positive and negative electrodes 142, 148 (e.g., by virtue of conductive residue from single-step milling operations required to form the patterning of the magnet structures).

Also, the region sandwiched between anti-parallel magnets in the MEES device 140A of FIGS. 14A-14B can be a thin non-ferromagnetic spacer material 158 that separates the interfacial coupling of the discrete upper 156 and lower 154 anti-parallel dipole oriented magnets. This spacer material 158 can be a dielectric (e.g., of low K value, of high k value, or even of magnetocapacitive materials) or in the alternative, a conductive non-magnetic material such as copper, aluminum, titanium, tungsten, gold, silver, ruthenium, tantalum, etc., or a conductive, antiferromagnetic material.

Alternative embodiments of the MEES device 140A shown in FIGS. 14A-14C provide for embedding the discrete magnets into the non-magnetic, conductive electrode plate, either fully or partially, as illustrated by the MEES device 140B shown in FIGS. 15A-15B. Like numbered components between FIGS. 14A-14B and 15A-15B are of the same structure, and hence further description of the same is omitted here for brevity. Similar to the manner of encapsulation described above for FIGS. 11A-12B, many different types of encapsulation may be used among different embodiments, including entire encapsulation (e.g., for all or a portion of the magnets in FIGS. 15 and/or 16, partial encapsulation (e.g., all but one surface for all or a portion of the magnets, majority of one or more magnets encapsulated in the dielectric or electrode, etc.). These designs may simplify and reduce the cost of fabrication as it prospectively eliminates the need to deposit a dielectric between the gaps formed from patterning the discrete magnets and the planarization of such dielectric material to provide for electrically conductive attachment of at least the top discrete magnets in the arrays.

FIGS. 16A-16B illustrate a three dimensional, cut-away perspective schematic view (FIG. 16A) and side elevation schematic view (FIG. 16B) of another embodiment of the MEES device 140C with a near fully (e.g., all but one of the surfaces is encapsulated into the non-magnetic electrode material) embedded pattern of discrete magnets 154, 156. Like numbered components between FIGS. 14A-14B and 16A-16B are of the same structure, and hence further description of the same is omitted here for brevity. The MEES device 140C of FIG. 16A provides a three dimensional, cut-away view of the design with partially (e.g., all but one surface, the majority of the magnet, etc., as similarly discussed above) embedded pattern of discrete magnets 154, 156. Also illustrated to the right (FIG. 16B) is a side view, cut away, perspective of the design (140C) with partially embedded pattern of discrete magnets 154, 156.

In one embodiment, the composite structure is to have the discrete magnetic structures electrically connected to the non-magnetic, low electrical resistance conductors on the side of the magnetic structures opposite of the contact surfaces to the dielectric material so as to minimize the distance of displacement current (i.e. charge) traveling through the comparatively high electrical resistance of magnetic materials. Such non-magnetic conductors effectively span the gaps of the magnetic portion of the electrodes so as to provide for capacitive effect to what otherwise would be non-capacitive surface area, with such non-magnetic conductors being either strips, or most preferably full capacitive plates. It is important to achieving the super colossal magnetic capacitance effect, high energy density storage and scalability to large geometric formats of the pattern of magnets that the non-magnetic conductor plates cover the region of magnetic flux passing through the dielectric layer so as to retain the high intensity magnetic field within the device structure and to have a high intensity magnetic field work in conjunction with the amplified electric field effect derived across the gap of the non-magnetic conductor plates of the device. The use of low electrically resistance material to form the upper and lower conductor plates of the device is beneficial as to deriving enhanced current carrying capacity and thus avail higher current charge and discharge cycling. An alternative embodiment is to have at least a part or all of the discrete magnets that are electrically connected to the non-magnetic, lower electrical resistance current conductors to be embedded into the surface of the non-magnetic, lower electrical resistance current conductors, as described above. Yet another embodiment would have the discrete magnets fully embedded into the non-magnetic, low electrical resistance current conductor plates, also as described above. Although the embodiments illustrated above in FIGS. 14A-16B show the magnets proximal to the "top" electrode, in some embodiments, the magnets may be proximal to the "bottom" plate, and or to be proximal to the "top" and to the "bottom" plate by duplicating such discrete magnetically coupled pairings near the "top" and the "bottom" plates.

One embodiment of an example stack-up 140A-1 for the MEES device 140A shown in FIG. 14A may be as illustrated in FIG. 17. It should be appreciated by one having ordinary skill in the art, within the context of the present disclosure, that the configuration (e.g., composition of material(s) and/or thicknesses) illustrated in FIG. 17 are for illustrative purposes, and that some embodiments may use different and/or other materials and/or thickness dimensions and arrangements.

The magnets of the structures for one or more embodiments of MEES devices and/or systems can be made of various ferromagnetic materials (e.g., with ferromagnetic properties), including individual elements or alloy combinations of ferromagnetic materials (e.g., iron, cobalt, nickel), which alloys can be provided with or without beneficial property inducing additives, e.g., nitrogen, boron, samarium, aluminum, copper, carbon, neodymium, dysprosium and the like, or could be made of Heusler alloys. The discrete magnetic structures can be of uniform material or formed of stacks of various compositions, for example, a monolithic layer of CoFe, or of NiFe or of CoNiFE, or stacks of thin film alloys such as CoFe overlaying a NiFe overlaying a CoFe layer, or a Cobalt seed layer with a CoFe layer, and other arrangements and combinations of thin film layers. The magnet stacks can utilize anti-ferromagnetic layers so as to aid in pinning a layer into a desired anti-parallel configuration. For instance, some MEES device embodiments may utilize a combination of ferromagnetic metals (e.g. Cobalt, Iron, Nickel and alloys of such) along with antiferromagnetic materials (e.g., FeMn) to provide for exchange biasing coupling within the magnetic structure(s), which may aid in pinning of the dipole directions and selective hardening the anisotropy of the corresponding magnetic structures. That is, in some embodiments, the use of antiferromagnetics may enhance the ability to differentiate the coercivity of a ferromagnetic architecture. In addition the use of antiferromagnetics may, due to exchange biasing, increase the overall hardness of ferromagnetics, which may lead to capacitors with enhanced "ruggedness" as to being less likely to be altered by external magnetic fields and/or change the frequency response characteristics of capacitors when used in an AC mode. In some embodiments, just one ferromagnetic layer may be pinned with exchange coupling to an antiferromagnetic material layer. In some embodiments, two discrete ferromagnetic layers may be coupled to an antiferromagnetic layer. In this instance, there is zero or insignificant additional spacer between the antiparallel magnetic dipole oriented ferromagnets, and instead, just an antiferromagnetic layer between the discrete ferromagnets.

One embodiment of a method of providing anisotropy (e.g., for an embodiment of an example MEES device) includes depositing the magnetic materials while under the influence of a magnetic field while the substrate is being held in its fixture in the deposition chamber, e.g. utilizing a DC powered electromagnetic field or a magnetic field provided by a permanent magnet. Furthermore, said method of deriving an anti-parallel dipole orientation includes depositing a first layer(s) of magnetic material(s) under the influence of one direction of a DC powered electromagnetic field and then depositing the anti-parallel magnetic structure under the influence of a reversed direction of a DC powered electromagnetic field. Post fabrication annealing under the influence of a magnetic field can be another mechanism utilized to achieve anisotropy and dipole orientation of magnetic layers, whereby the magnetic structures that are desired to be placed in anti-parallel magnetic alignment have different coercivity properties so that they will align in an anti-parallel configuration during annealing when the magnetic field induced in the annealing chamber is reversed as the temperature is changed in the annealing chamber. Another method of aligning the magnetic stacks into desired anti-parallel configuration is to construct one magnetic structure composed of magnetic materials so as to have a field strength that is capable of coercing the other magnetic structure after both magnetic structures are caused to come into common magnetic alignment during magnetic annealing.

The anti-parallel, magnetic stacks can be patterned into various configurations (e.g., shapes and dimensions), including but not limited to, rectangles, elliptical, oval, diamond, half-circle, and/or rectangles with triangular or rounded dipole end regions. Such shaping can provide for enhanced shape anisotropic and/or flux focusing purposes, and/or to allow for improved densification of dipole ends per unit of surface area of the device, and/or to derive magnetic field strengthening and/or flux densification of the magnetic circuit. Each of the discrete, anti-parallel, coupled magnetic stacks do not have to be similar to the adjacent anti-parallel, coupled magnetic stack as a blended array of stacks could be used to increase the density of total anti-parallel magnetic stack per area of horizontal surface area. Some example magnet configurations (e.g., geometrical dimensions and magnet spacings) for a 2×3 magnet, composite structure array are illustrated in FIG. 18, with the understanding that other configurations (e.g., dimensions, geometrical configurations, and/or spacings) may be used in some embodiments. For instance, though shown in a 2×3 arrangement, in some embodiments, pairings of discrete magnets may be a single pair, or more than a single pair (e.g., tens of pairs, hundreds of pairs, thousands of pairs, etc.), as should be appreciated by one having ordinary skill in the art in the context of the present disclosure.

In some embodiments, the magnetically enhanced energy device composite structures can be repeated in alternating electrical polarity in the axial direction (i.e., the Z direction) to provide for stacks of energy storage devices in parallel circuitry for greater energy density per unit of substrate surface area. FIGS. 19A and 19B illustrate a MEES device embodiment, denoted as MEES device 190A, whereby discrete magnets 192 of the composite structure have at least one (e.g., 194) of the magnetically coupled pair of magnets 192 conductively connected to a conductor 196 where electrons are displaced towards (e.g., stored) when the MEES device 190A is charged. FIGS. 21C-21D illustrate an embodiment of a MEES device 190B whereby the discrete magnets 192 of the composite structure have one each of the magnetically coupled pair of magnets 192 conductively connected to each of both of the opposing electrical polarity conductor structures 196, 198.

Figure 20B:
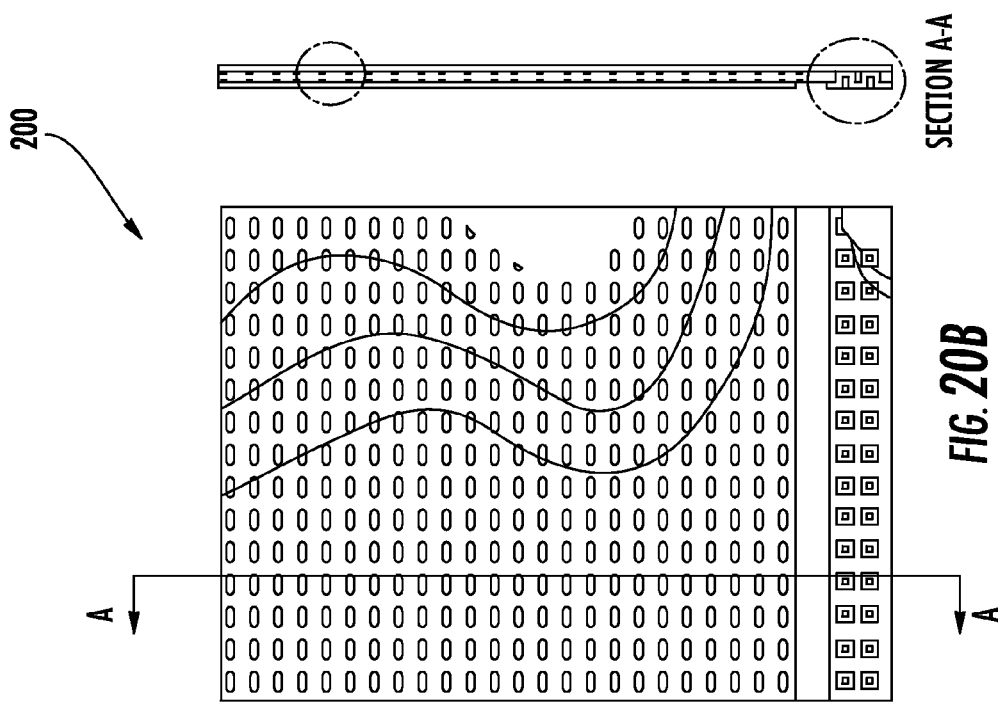
FIGS. 20A-20D are schematic diagrams in different views that illustrate an example array of magnetic structures of an embodiment of an example MEES device.
Figure 20A:
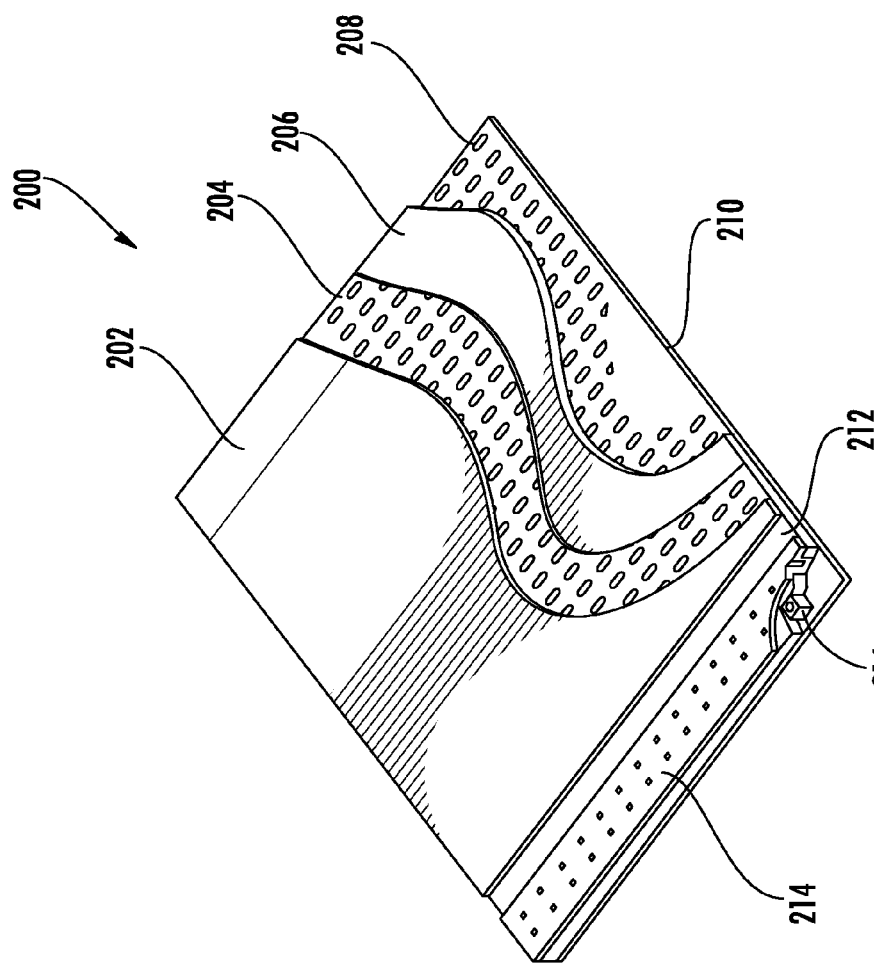

FIG. 20A shows in a cut-away illustration a representative example of an embodiment of an example MEES device 200 configured as a flip chip design. The MEES device 200 comprises a metal contact pad area 202 disposed above, and adjacent to, a magnet array 204. The magnet array 204 is disposed above, and adjacent to, a dielectric 206. The dielectric 206 is disposed above, and adjacent to, a magnet array 208, which is disposed above and adjacent to a metal 210. Also shown laterally adjacent the structure (e.g., 202-210) is a pad gap 212. The pad gap 212 may be an air/dielectric. Laterally adjacent the pad gap 212 is a metal contact pad area 214 comprising metal vias 216. FIG. 20B provides a top down, cut-away perspective of an example of the array of discrete, magnetically coupled pairings of the magnetic structures 204, 208 and a sectional view showing in this embodiment wherein one of the paired magnetic structures 204, 208 is conductively contacted to each of the non-magnetic conductor materials of the composite structure, which conductive contacts are detailed in the close up view of FIG. 20C which depicts the upper circled region of FIG. 20B.

Figure 20C:
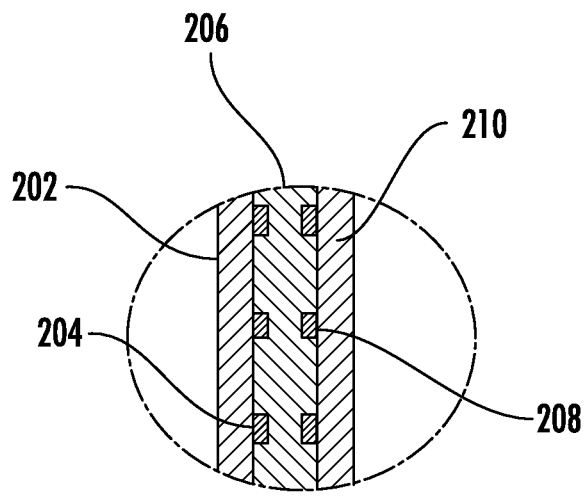
Figure 20D:
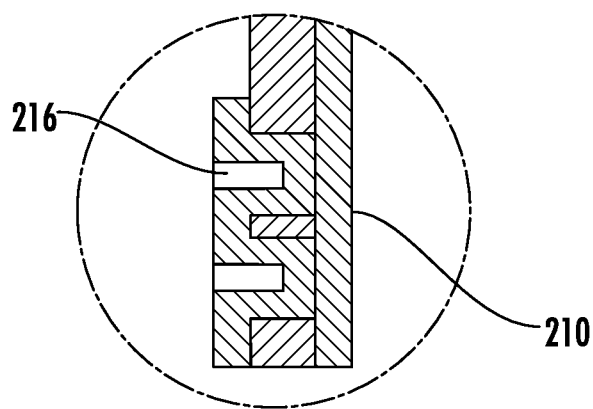

FIGS. 20C-20D illustrate close up views of the details of the circled regions of the sectional view of FIG. 20B. Referring to FIG. 20C, shown are example constituent materials of the composite structure, including on one end, the metal contact pad area 202 and the magnet 204 disposed adjacent the pad 202, and on the other end, the metal 210, the magnet 208 disposed adjacent the metal 210, and the dielectric 206 sandwiched in between both end structures. FIG. 20D shows the construction of the vias 216 leading from the bottom conductor 210 to provide for a contact surface 214 on the top of a flip chip design of the MEES device 200.

As described above, it has been observed that the prior art structures share a common shortcoming in that at least one of their electrodes is constructed as to having a magnet span the entire breadth of the electrode, which results in their flux circuitry passing stray to the electric field so as to not allow for a combined magnetic field and electric field influence within their devices, and/or such prior art circuitry may result in magnetic field strength weakening if such structures are scaled to larger dimensions in an attempt to increase the total energy storage.

In contrast, certain embodiments of MEES systems utilize magnetic coupling of discrete pairs of magnets to result in minimizing the magnetic flux circuits pathway through high reluctance (i.e., non-magnetic materials) so as to retain strong magnetic field strength and to cause the magnetic flux circuit to be fully or predominately contained inside the MEES device structure (e.g., in the dielectric and/or the non-magnetic conductor plate) so as to provide beneficial capacitive effects.

In some embodiments, MEES devices may use, for instance, two constituent materials, discrete magnetized magnetic material elements, and non-magnetic conductor material elements, to derive a composite structure, which composite structure unexpectedly yields electrical properties and energy storage results that exceed the sum of the individual constituent parts.

Composite materials (also called composition materials or shortened to composites) refer to materials made from two or more constituent materials with significantly different physical, chemical, electrical and/or magnetic properties, that when combined, produce a material with characteristics different from the individual constituent materials and/or components. Within the composite, the individual components remain separate and distinct within the finished structure. The new material may be preferred for many reasons.

The fact that the structures of certain embodiments of MEES devices derive characteristics different from the individual components including deriving sCMC effect and values, would not be expected. In fact, MEES devices derive results that exceed the capacitance of the individual constituent materials and components.

Figure 21:
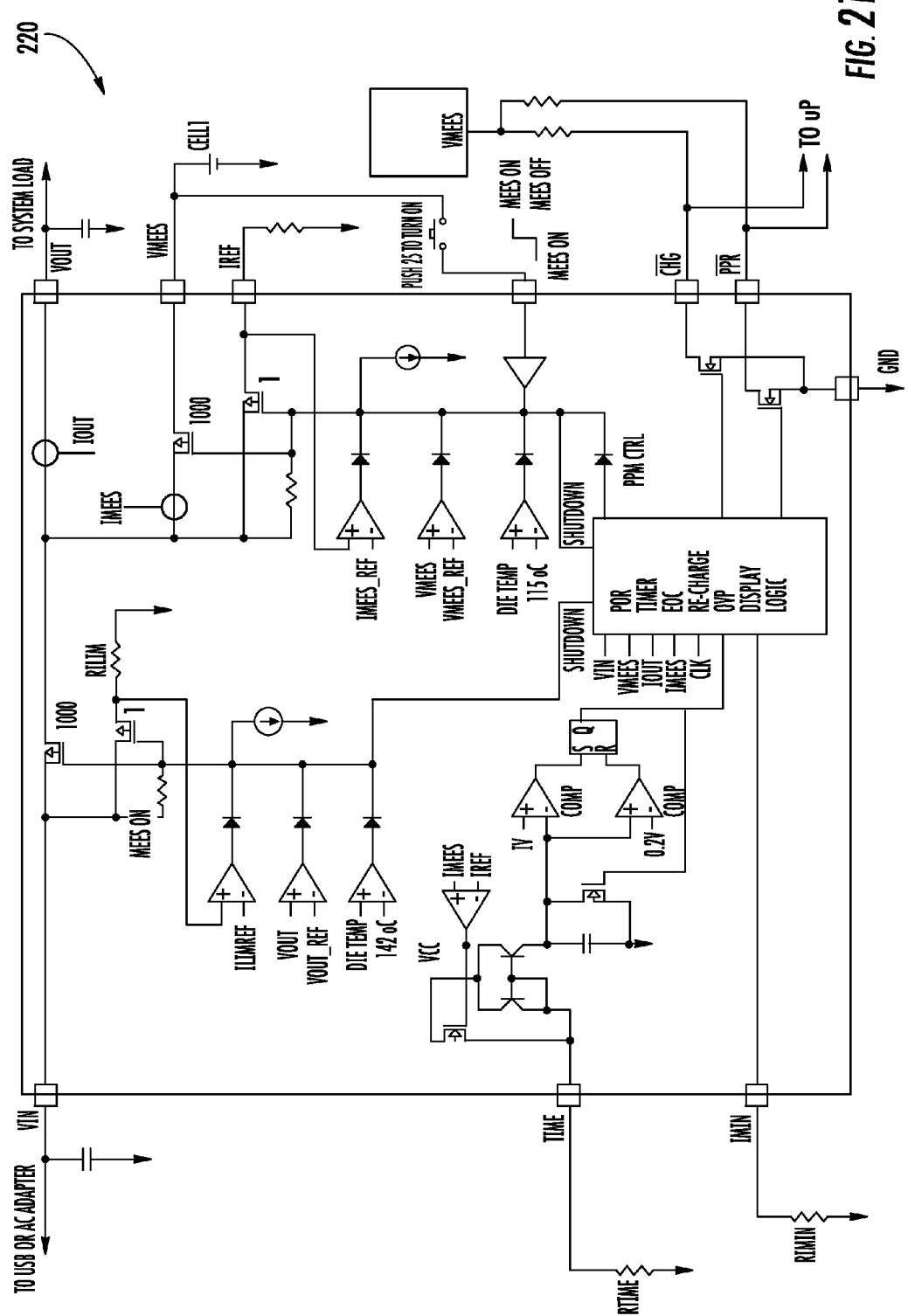
FIG. 21 is a schematic diagram that illustrates an embodiment of an example circuit for operating a MEES device.

FIG. 21 provides an example circuit 220 for operating a MEES device. The circuit 220 is a fully integrated high input voltage MEES device charger with power path management function. This MEES charger is capable of performing the Charge Current/Charge Voltage (CC/CV) charge function. The charger accepts an input voltage up to Vmax but is disabled when the input voltage exceeds Vovp OVP threshold. The charge current and the end-of-charge (EOC) current are programmable with external resistors. When the charge current reduces to the programmable EOC current level during the CV charge phase, the EOC indicator (CHG) will toggle to logic HIGH to indicate the end-of-charge condition. The charger will continue to charge until the user programmed timeout interval has elapsed, then the charger is terminated. The circuit 220 uses separate power paths to supply the system load and charge the MEES device. This feature allows the system to immediately operate with a completely discharged MEES device. This feature also allows the charge to terminate when the MEES device is full charged while continuing to supply the system with the input source, thus minimizing unnecessary charge/discharge cycles. Two indication pins (PPR and CHG) allow simple interface to a microprocessor or LEDs.

Figure 22:
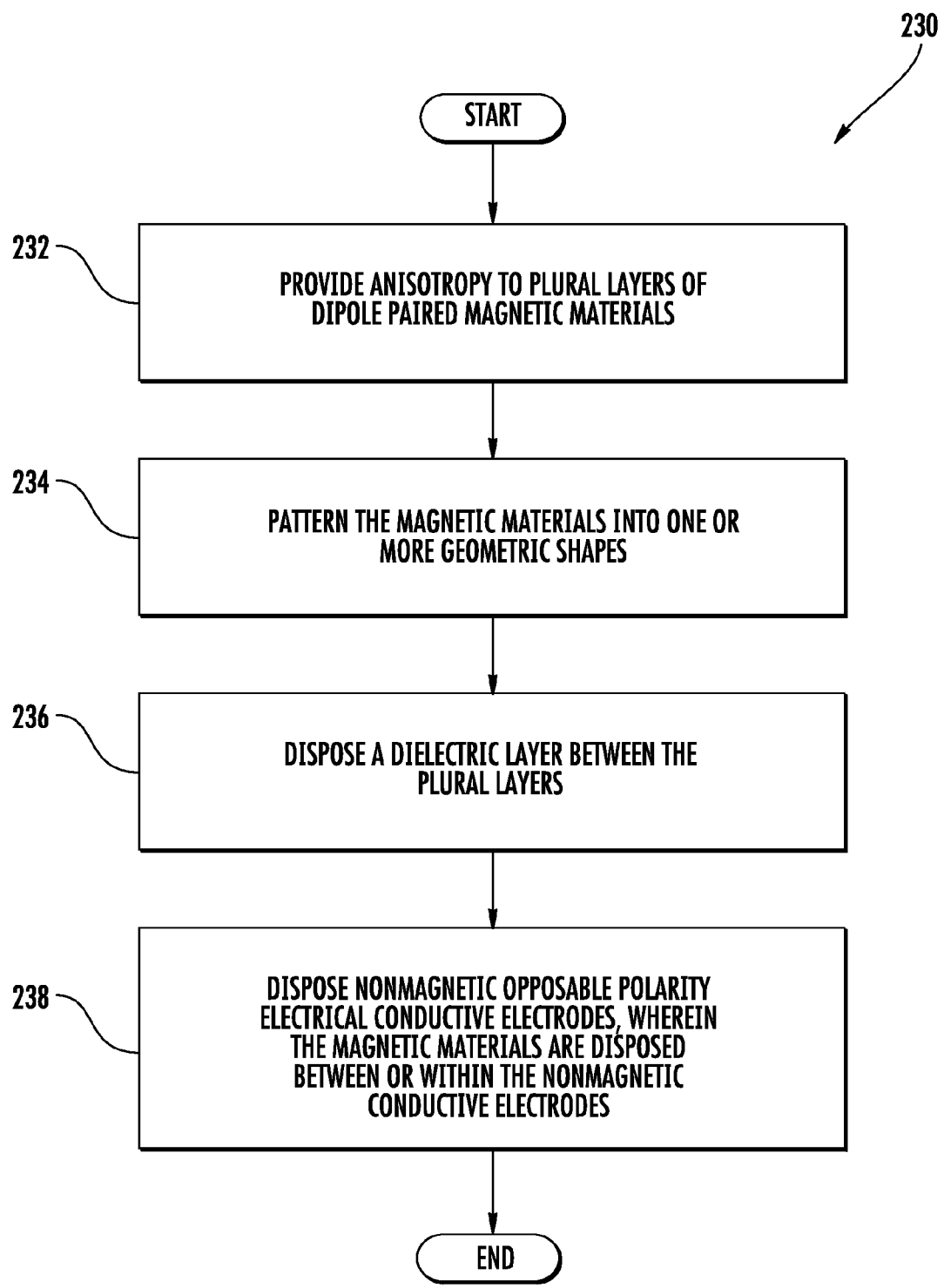
FIG. 22 is a flow diagram that illustrates an embodiment of an example MEES method.

In view of the above description, it should be appreciated that one embodiment of a method 230, as depicted in the flow diagram of FIG. 22, comprises providing anisotropy to plural layers of dipole paired magnetic materials (232); patterning the magnetic materials into one or more geometric shapes (234); disposing a dielectric layer between the plural layers (236); and disposing nonmagnetic opposable polarity electrical conductive electrodes, wherein the magnetic materials are disposed between or within the nonmagnetic conductive electrodes (238).

Any process descriptions or blocks in flow diagrams should be understood as representing steps and/or modules, segments, or portions of code which include one or more executable instructions for implementing specific logical functions or steps in the process, and alternate implementations are included within the scope of the embodiments in which functions may be executed out of order from that shown or discussed, including substantially concurrently, depending on the functionality involved, as would be understood by those reasonably skilled in the art of the present disclosure.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and protected by the following claims.

The invention claimed is:

1. A system, comprising:
   plural non-magnetic conductive electrodes, comprising at least:
      a first non-magnetic conductive electrode;
      a second non-magnetic conductive electrode;
   a dielectric layer disposed between the first and second electrodes, the dielectric layer extending between the first and second electrodes; and first and second layers comprising plural pairs of magnetically coupled pairings of discrete magnets which magnetically coupled pairings of discrete magnets comprise discrete magnetized magnetic material elements and inherent magnetic fields circuit elements which circuit paths are situated completely, or nearly completely within the confines of the volume of space spanned by and between the opposing electrical polarity conductive electrodes, the first and second layers separated by a non-magnetic material, wherein the magnets of at least the first layer are conductively connected to the first non-magnetic conductive electrode, wherein the magnets of the second layer are also conductively connected to the first non-magnetic conductive electrode, wherein the magnets of the first and second layers are electrically uncoupled from the second non-magnetic conductive electrode.

2. The system of claim 1, wherein the first and second layers are entirely embedded in the dielectric layer.

3. The system of claim 1, wherein for each of the plural pairs, one magnet of a pairing in the first layer provides an antiparallel dipole orientation relative to the other magnet of a pairing in the second layer.

4. The system of claim 1, wherein the non-magnetic material that separates the first and second layers comprises one of either a dielectric or a conductive material.

5. The system of claim 1, wherein the non-magnetic material that separates the first and second layers comprises an antiferromagnetic material.

6. The system of claim 1, wherein all of the magnets all comprise a same, uniform configuration, wherein the configuration comprises one or a combination of geometry, composition, or dimensions.

7. The system of claim 1, wherein the magnets of at least a first layer or pairing of the discrete magnets comprise a ferromagnetic material, an antiferromagnetic material, or a combination of both ferromagnetic and antiferromagnetic materials.

8. The system of claim 1, wherein a magnetic flux field resides completely or predominantly between a volume of space spanned by and between the first and second non-magnetic conductive electrodes.

* * * * *